US010777766B2

(12) United States Patent
Im et al.

(10) Patent No.: US 10,777,766 B2
(45) Date of Patent: Sep. 15, 2020

(54) ORGANIC LIGHT-EMITTING DIODE DISPLAY DEVICE AND METHOD OF FABRICATING THE SAME

(71) Applicant: LG Display Co., Ltd., Seoul (KR)

(72) Inventors: JongHyeok Im, Busan (KR); SeJune Kim, Gyeonggi-do (KR); JoonSuk Lee, Seoul (KR); SoJung Lee, Gyeonggi-do (KR); JaeSung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/206,124

(22) Filed: Nov. 30, 2018

(65) Prior Publication Data

US 2019/0097161 A1    Mar. 28, 2019

Related U.S. Application Data

(63) Continuation of application No. 14/796,090, filed on Jul. 10, 2015, now Pat. No. 10,181,573.

(30) Foreign Application Priority Data

Jul. 11, 2014  (KR) .................. 10-2014-0087665
Jul. 11, 2014  (KR) .................. 10-2014-0087751
Jul. 9, 2015   (KR) .................. 10-2015-0097544

(51) Int. Cl.
*H01L 51/56*    (2006.01)
*H01L 51/52*    (2006.01)
(Continued)

(52) U.S. Cl.
CPC ...... *H01L 51/5203* (2013.01); *H01L 27/3276* (2013.01); *H01L 51/0017* (2013.01);
(Continued)

(58) Field of Classification Search
None
See application file for complete search history.

(56) References Cited

U.S. PATENT DOCUMENTS

2003/0122498 A1 *  7/2003  Park ............... H01L 27/3279
                                                    315/169.3
2004/0021414 A1    2/2004  Hanawa et al.
(Continued)

FOREIGN PATENT DOCUMENTS

EP    1796171 A2    6/2007
EP    2463911 A2    6/2012

OTHER PUBLICATIONS

Extended European Search Report dated Nov. 20, 2015, for corresponding European Patent Application No. 15176244.0.
(Continued)

*Primary Examiner* — Jay C Chang
(74) *Attorney, Agent, or Firm* — Morgan, Lewis & Bockius LLP

(57) ABSTRACT

An organic light-emitting diode (OLED) display device and a method of fabricating the same can reduce resistance of a cathode by forming an auxiliary electrode. Also, such OLED display device and method can prevent damage on a pad electrode due to an etchant during patterning of an anode by applying a protective structure to the pad electrode of a pad area and by including the pad electrode exposed from a plurality of pad electrode layers.

9 Claims, 19 Drawing Sheets

(51) Int. Cl.
*H01L 27/32* (2006.01)
*H01L 51/00* (2006.01)

(52) U.S. Cl.
CPC ...... *H01L 51/5206* (2013.01); *H01L 51/5228* (2013.01); *H01L 51/5237* (2013.01); *H01L 51/56* (2013.01); *H01L 51/5218* (2013.01); *H01L 2251/5315* (2013.01)

(56) References Cited

U.S. PATENT DOCUMENTS

| | | |
|---|---|---|
| 2005/0110023 A1 | 5/2005 | Lee et al. |
| 2006/0091396 A1 | 5/2006 | Lee et al. |
| 2009/0284451 A1 | 11/2009 | Yamamoto et al. |
| 2009/0315451 A1 | 12/2009 | Choi et al. |
| 2011/0140113 A1 | 6/2011 | Park et al. |
| 2011/0303930 A1* | 12/2011 | Bang ................ H01L 51/5228 257/91 |
| 2013/0001564 A1 | 1/2013 | Choi et al. |
| 2014/0035478 A1 | 2/2014 | Kitakado et al. |
| 2014/0042394 A1 | 2/2014 | Lee et al. |

OTHER PUBLICATIONS

Chinese Office Action dated Apr. 16, 2018, issued in corresponding Chinese Application No. 201510528013.0.

* cited by examiner

ORGANIC LIGHT-EMITTING DIODE DISPLAY DEVICE AND METHOD OF FABRICATING THE SAME

CROSS-REFERENCE TO RELATED APPLICATION

This application is a continuation of U.S. patent application Ser. No. 14/796,090, filed on Jul. 10, 2015, the entire contents of which is incorporated by reference herein. Pursuant to 35 U.S.C. § 119(a), U.S. patent application Ser. No. 14/796,090 claims the benefit of earlier filing date and right of priority to Korean Application Nos. 10-2014-0087665, filed on Jul. 11, 2014, 10-2014-0087751 filed on Jul. 11, 2014, and 10-2015-0097544 filed on Jul. 9, 2015, the contents of which are incorporated by reference herein in their entireties.

BACKGROUND OF THE DISCLOSURE

1. Field of the Disclosure

This specification relates to an organic light-emitting diode (OLED) display device and a method of fabricating the same, and more particularly, a top emission type OLED display device and a method of fabricating the same.

2. Background of the Disclosure

As the interest in information display and demand on the use of portable information media increase, research efforts and commercialization are focusing mainly on display devices such as flat panel displays (FPDs) which are light in weight and thin in thickness.

Specifically, among such displays, liquid crystal display (LCD) devices have seen widespread use in view of its light weight and low power consumption.

As another display device, an organic light-emitting diode (OLED) display device emits light by itself and thus exhibits more excellent viewing angle and contrast ratio than the LCD device. Also, the OLED display device does not need a backlight and thus is advantageous in reduced weight, thickness and power consumption. The OLED display device is also current driven based upon a direct-current (DC) low voltage and exhibits a fast response speed.

Hereinafter, the basic structure and operation characteristics of an OLED display device will be described with reference to the drawings.

FIG. 1 is a diagram illustrating a light-emitting principle of a typical OLED.

An OLED display device typically includes an OLED having a structure as illustrated in FIG. 1.

Referring to FIG. 1, the OLED includes an anode 18 as a pixel electrode, a cathode 28 as a common electrode, and an organic compound layer(s) 31, 32, 35, 36 and 37 formed between the anode 18 and the cathode 28.

Here, the organic compound layer(s) 31, 32, 35, 36 and 37 includes a hole injection layer 31, a hole transport layer 32, an emission layer 35, an electron transport layer 36, and an electron injection layer 37. All or some of these layers may be separate or some may be combined together such that one layer is implemented with multiple functions.

With the configuration of the OLED, when positive (+) and negative (−) driving voltages are applied to the anode 18 and the cathode 28, respectively, holes passed through the hole transport layer 32 and electrons passed through the electron transport layer 36 are moved to the emission layer 35 to form excitons. When the excitons transit from an excited state into a base state, namely, a stable state, light with a predetermined wavelength is emitted.

In the OLED display device, sub pixels each having the OLED with the aforementioned structure are arranged in the matrix configuration. The sub pixels are selectively controlled by a data voltage and a scan voltage, to display various colors that collectively form an image.

Here, the OLED display device can be categorized into a passive matrix type and an active matrix type using thin film transistors (TFT) as switching elements. Of those types, in the active matrix type OLED display device, the TFT as an active element is selectively turned on to select a sub pixel and light emission of the sub pixel occurs due to voltage charged in a storage capacitor.

The OLED display device may also be categorized according to a light-emitting direction into a top emission type, a bottom emission type and a dual emission type.

The top emission type OLED display device is configured to emit light in a direction away from a substrate on which the sub pixels are arranged. The top emission type OLED display device is advantageous in that aperture ratio is greater than that of a bottom emission type in which light is emitted toward and through the substrate with the sub pixels arranged thereon.

The top emission type OLED display device includes an anode provided below an organic compound layer and a cathode provided above the organic compound layer through which light is transmitted.

Here, the cathode should be formed thin (~100 Å) enough to be implemented as a semi-transparent layer with a low work function. However, doing so causes the cathode to have high resistance.

The thusly-configured top emission type OLED display device results in formation of a voltage drop (IR drop) by high specific resistance of the cathode. Accordingly, undesirably different levels of voltages are applied to sub pixels, respectively. This brings about non-uniform luminance or image quality. Specifically, as a size of a panel increases more, the voltage drop (IR drop) problem may become aggravated.

The OLED display device can be divided into a display area and a pad area located outside the display area.

The TFT and the OLED are formed in the display area.

A pad electrode is formed in the pad area to apply a signal voltage from an external power source to the TFT and the OLED.

In this case, pad electrodes formed in the pad area may suffer from corrosion due to moisture and oxygen. In addition, the corrosion may be caused by a specific etchant with respect to the material constituting the pad electrode. When the pad electrode corrodes, the transmission of signals is problematic, and thus the overall device reliability decreases.

SUMMARY OF THE DISCLOSURE

Accordingly, the present invention is directed to a n organic light-emitting diode (OLED) display device and method of manufacturing the same that substantially obviate one or more of the problems due to limitations and disadvantages of the related art.

An object of the present invention is to provide an organic light-emitting diode (OLED) display device, capable of preventing (or minimizing) corrosion on a pad electrode caused by moisture and oxygen and preventing (or minimizing) damage on the pad electrode caused by an etchant during patterning of an anode, and a method of fabricating the same.

Another object of the present invention is to provide an OLED display device, capable of simplifying the process required to form a plurality of the pad electrode layers, and a method of fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of this specification, as embodied and broadly described herein, an organic light-emitting diode (OLED) display device comprises a thin film transistor on a display area of a substrate; an OLED connected to the thin film transistor; and a plurality of pad electrodes comprising at least a first pad electrode layer, a second pad electrode layer and a third pad electrode layer on a pad area of the substrate, wherein the first pad electrode layer below the second pad electrode layer may be an adhesion promoting layer, wherein the second pad electrode layer may be formed of a low resistive material compared with materials of the first and third pad electrode layers, and wherein the third pad electrode layer above the second pad electrode layer may serves the purpose of an etch stopper or the second pad electrode layer.

In another aspect, an organic light-emitting diode (OLED) display device comprises a substrate including a display area and a pad area; a pad line and a pad electrode in the pad area; and a patterned anode, configured by etching, in the display area, wherein the pad electrode may be a three-layered structure, wherein an uppermost layer and a lowermost layer of the three-layered structure may be of the same material, and wherein the uppermost layer may not be etched by an etchant which may be used to pattern the anode, and may be formed of a material to prevent corrosion of an intermediate layer of the three-layered structure.

In another aspect, a method of fabricating an organic light-emitting diode (OLED) display device comprises forming a thin film transistor on a display area of a substrate; forming a pad electrode having a three-layered structure on a pad area of the substrate; forming an open hole exposing a portion of an uppermost layer of the pad electrode by selectively etching a passivation layer on the pad area; and patterning an anode on the passivation layer over the thin film transistor by etching, wherein the uppermost layer exposed via the open hole may not be etched during the patterning of the anode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure. In the drawings.

DETAILED DESCRIPTION OF THE DISCLOSURE

Figure 1:
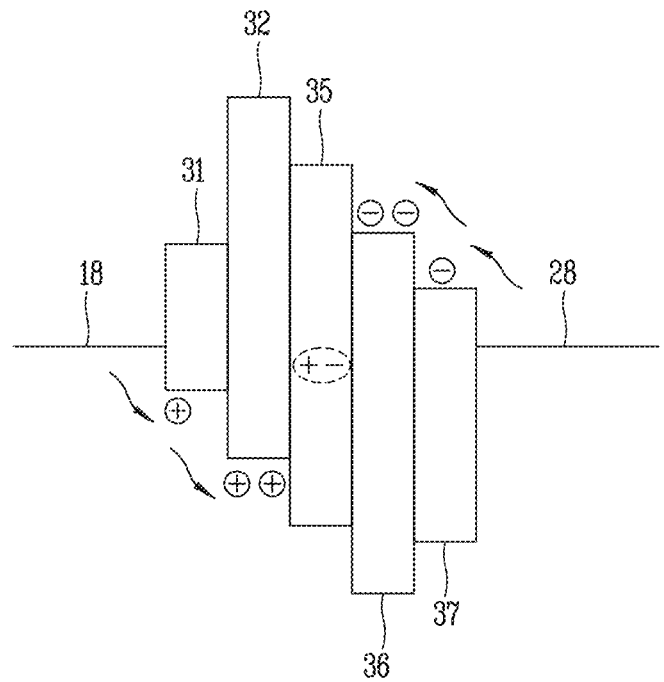
FIG. 1 is a diagram illustrating a light-emitting principle of a typical organic light-emitting diode (OLED)

Description will now be given in detail of certain embodiments of an organic light-emitting diode (OLED) display device and a method of fabricating the same according to the present invention, with reference to the accompanying drawings.

Advantages and features of the present invention and methods of achieving those will be understood with reference to the accompanying drawings and exemplary embodiments to be explained later in detail. Exemplary embodiments of the inventive concepts may, however, be embodied in many different forms and should not be construed as being limited to the embodiments set forth herein; rather, these embodiments are provided so that this disclosure will be thorough and complete, and will fully convey the concepts of the example embodiments to those of ordinary skill in the art. The same/like reference symbols can refer to the same/like components throughout the specification. In the drawings, the thicknesses of layers and regions may have been exaggerated for clarity.

It will be understood that when an element is referred to as being "on" another element, the element can be located on the other element or intervening elements may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the exemplary term "below" can encompass both an orientation of above and below.

The terminology used herein is for the purpose of describing particular embodiments only and is not intended to be limiting of the example embodiments unless otherwise stated. As used herein, the singular forms are intended to include the plural forms as well, unless the context clearly indicates otherwise. It will be further understood that the terms "comprises", "comprising", "includes" and/or "including," if used herein, specify the presence of stated steps, operations, elements and/or components, but do not preclude the presence or addition of one or more other features, integers, steps, operations, elements, components and/or groups thereof.

Figure 2:
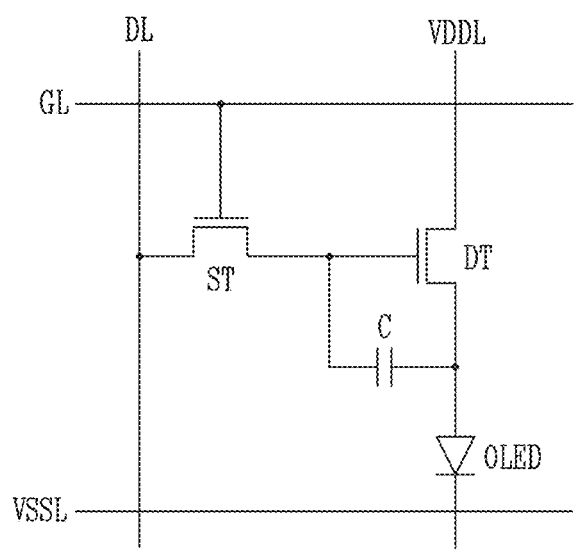
FIG. 2 is a view illustrating a sub pixel structure of an OLED display device.

FIG. 2 is a view illustrating a sub pixel structure of an OLED display device.

As illustrated in FIG. 2, an OLED display device includes a sub pixel region which is defined by a gate line GL arranged in a first direction, a data line DL arranged in a second direction, intersecting with the first direction, with being spaced apart from the gate line GL, and a driving power line VDDL. Alternatively, sub pixel regions can be defined by other means irrespective of the gate lines and data lines.

One sub pixel region may include a switching thin film transistor (TFT) ST, a driving TFT DT, a storage capacitor C and an OLED.

The switching TFT ST is switched (or otherwise operated) in response to a gate signal applied to the gate line GL to supply a data signal, which is supplied to the data line DL, to the driving TFT DT.

The driving TFT DT is switched (or otherwise operated) in response to the data signal supplied from the switching TFT ST, to control a current flowing from the driving power line VDDL to the OLED.

The storage capacitor C is connected between a gate electrode of the driving TFT DT and a base power line VSSL to hold (or store) a voltage corresponding to the data signal supplied to the gate electrode of the driving TFT DT, and constantly maintains a turn-on state of the driving TFT DT for one frame by use of the stored voltage.

The OLED is electrically connected between a source electrode or a drain electrode of the driving TFT DT and the base power line VSSL, to emit light by means of organic material that reacts to the current corresponding to the data signal supplied from the driving TFT DT.

Figure 3:
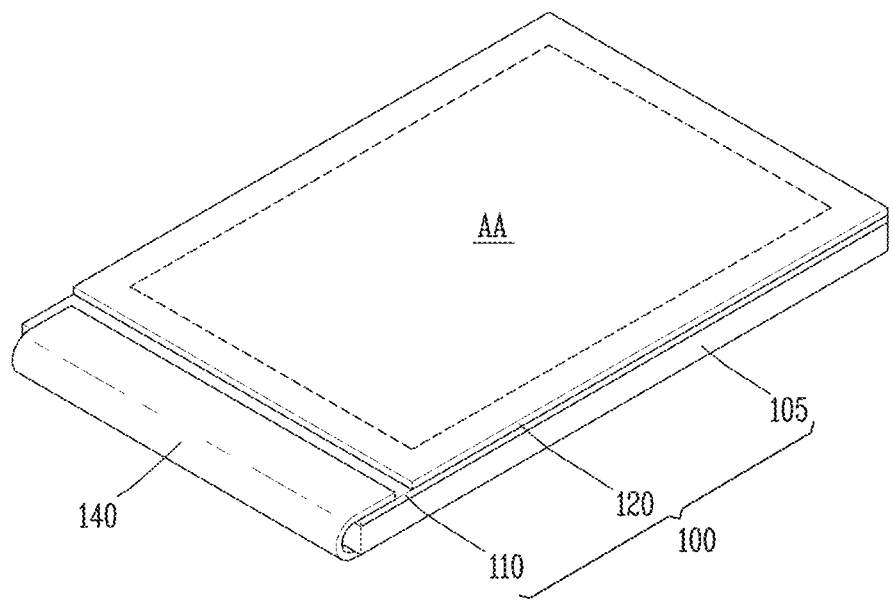
FIG. 3 is a perspective view exemplarily illustrating a structure of an OLED display device in accordance with a first embodiment of the present invention.

FIG. 3 is a perspective view exemplarily illustrating a structure of an OLED display device in accordance with a first embodiment of the present invention. Here, FIG. 3 exemplarily illustrates an OLED display device with a flexible printed circuit board (FPCB) coupled to a pad area thereof. Such FPCB may be implemented in different forms and be labeled as various names, but all such configurations serve the purpose of providing an interface (via the pad area) between a panel having various OLED components thereon and external circuits (i.e. circuits not on the panel itself) that provide signals and control to such panel. Here, the panel may be relatively rigid (typically made of glass) or relatively flexible (typically made of plastic), which is selectively used depending upon the type and application of the OLED display device to which such panel will be implemented in.

Figure 4A:
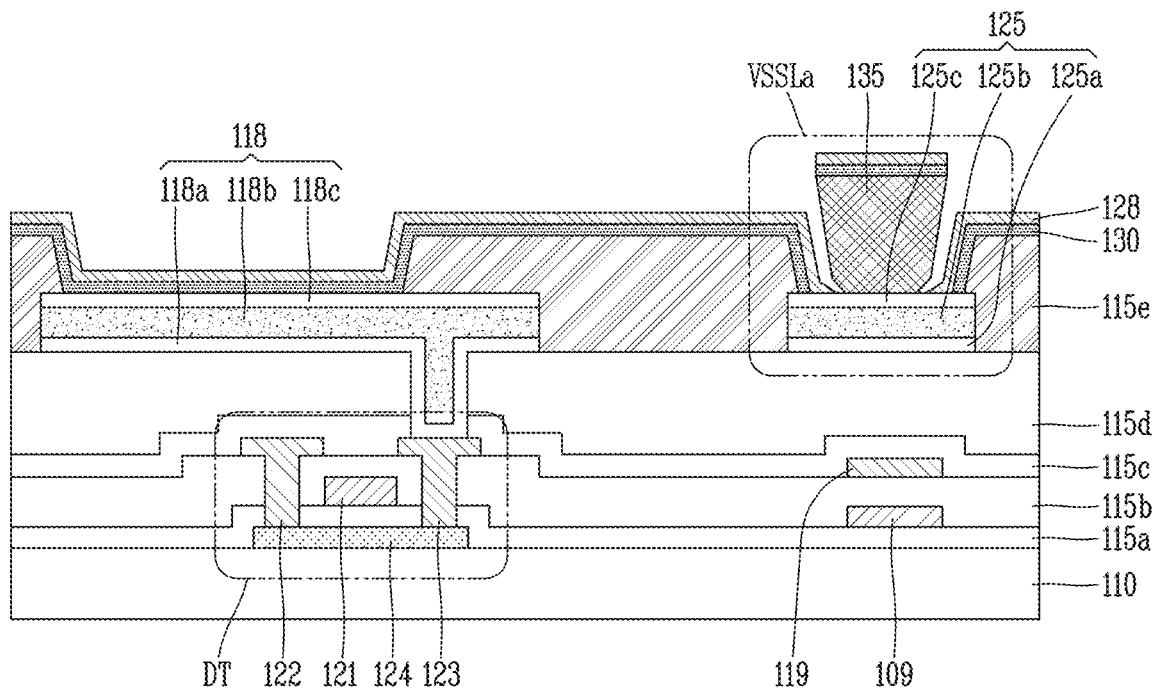
FIGS. 4A and 4B are sectional views schematically illustrating a partial structure of the OLED display device in accordance with the first embodiment of the present invention.
Figure 4B:
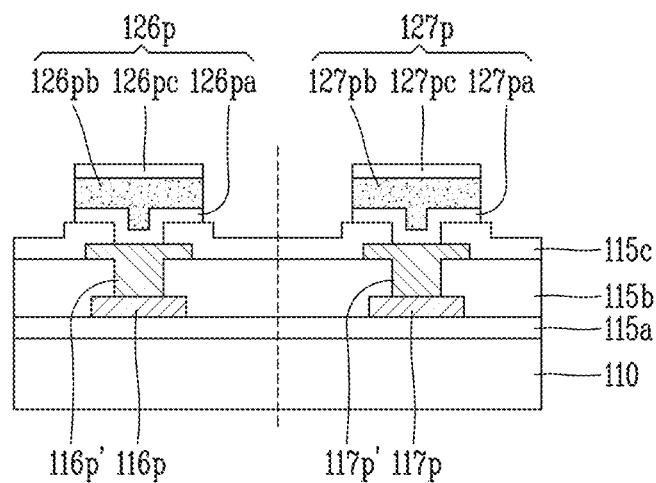

FIGS. 4A and 4B are sectional views schematically illustrating a partial structure of the OLED display device in accordance with the first embodiment of the present invention.

Here, FIG. 4A exemplarily illustrates one sub pixel including a TFT part and a capacitor forming part of the OLED display device, and FIG. 4B exemplarily illustrates parts of a gate pad area and a data pad area in a sequential manner.

Specifically, FIG. 4A illustrates an example of a top emission type OLED display device using a coplanar TFT. However, the present invention may not be limited to the coplanar TFT. Other types of TFT structures, such as a staggered TFT, can be implemented as well. Additionally, a plurality of transistor types can be implemented on a single panel or substrate (MTSS: Multiple TFTs on Single Substrate), whereby two or more types of different transistors based on different active materials, such as amorphous silicon, polysilicon (including low temperature polysilicon: LTPS), oxide semi-conductive materials (oxide TFTs), organic materials (O-TFTs), etc., which allow various TFT combinations to be used on a single panel or substrate in order to take advantage of each type of transistor's advantageous characteristics.

Referring to FIG. 3, the OLED display device according to the first embodiment of the present invention may include a panel assembly 100 used in displaying images, and an FPCB 140 coupled to the panel assembly 100 to allow signals and control to be sent and received with other circuits and components.

The panel assembly 100 may include a (TFT) substrate 110 on which a display area (or active area, AA) and a pad area (or non-active area) are defined, and an encapsulation layer 120 on the (TFT) substrate 110 for encapsulating the display area AA.

Here, the pad area (in its entirety or portions thereof) may be exposed without being encapsulated by the encapsulation layer 120.

The substrate 110 having an array of TFTs, OLEDs and the like thereon is a base substrate and may be implemented as a polyimide substrate. Here, a back plate 105 may be attached onto a rear surface of the substrate 110.

A polarizer for preventing reflection of incident light coming from outside the panel assembly may be attached on the encapsulation layer 120.

Here, sub pixels are arranged in a matrix or array configuration on the display area AA of the substrate 110. On an outside of the display area AA (i.e. at the non-display area) may be located driving elements, such as a scan driver and a data driver for driving the sub pixels, and other components.

Hereinafter, the display area AA of the substrate 110 is described in detail with reference to FIG. 4A. As illustrated in FIG. 4A, the OLED display device according to the first embodiment of the present invention may include a substrate 110, a driving TFT DT, an OLED and an auxiliary electrode line VSSLa.

The driving TFT DT includes a semiconductor layer 124, a gate electrode 121, a source electrode 122 and a drain electrode 123.

The semiconductor layer 124 is formed on a substrate 110 which is made of an insulating material, such as silicon Si, glass, transparent plastic or a polymer film. But it is not limited to this. In other words, the substrate 110 may be formed from any material capable of supporting various layers and elements.

The semiconductor layer 124 may be made of amorphous silicon, polycrystalline silicon with crystallized amorphous silicon, oxide semiconductor, organic semiconductor and the like.

Here, a buffer layer may be located between the substrate 110 and the semiconductor layer 124. The buffer layer may be formed to protect the TFTs, which are formed in subsequent processes, from impurities such as alkaline ions discharged from the substrate 110.

A gate insulating layer 115a, which is made of silicon nitride SiNx or silicon dioxide ($SiO_2$) (or silicon oxide), is formed on the semiconductor layer 124, and a gate line including the gate electrode 121 and a lower sustaining electrode 109 are formed on the gate insulating layer 115a.

The gate insulating layer 115a may be formed in the display area and the pad area. In other words, the gate insulating layer 115a may be formed on the entire surface of the substrate 110 provided with the semiconductor layer 124. But it is not limited to this.

The gate electrode 121 may be formed in such a manner as to overlap (or otherwise overlay, super-impose, cover, encroach, etc.) with the semiconductor layer 124 within the display area.

The gate electrode 121 and the gate line may be formed in a single body united (or integrated) with each other.

The gate electrode 121, the gate line and the lower sustaining electrode 109 may be formed of a first metallic material having a low resistance characteristic, such as aluminum (Al), copper (Cu), molybdenum (Mo), chrome (Cr), gold (Au), titanium (Ti), nickel (Ni), neodymium (Nd), or alloy thereof.

Although the gate electrode 121, the gate line and the lower sustaining electrode 109 are depicted to be formed as a single layer, they may be formed in a multi-layered structure including at least two layers.

An inter-layer insulating layer 115b which is made of silicon nitride, silicon oxide or silicon dioxide can be provided on the gate electrode 121, the gate line and the lower sustaining electrode 109. On the inter-layer insulating layer 115b, a data line, a driving voltage line, source and drain electrodes 122 and 123 and a upper sustaining electrode 119 can be provided.

Also, a plurality of contact holes (or other type of openings, vias, etc.) may be formed in the inter-layer insulating layer 115b.

The source electrode 122 and the drain electrode 123 are spaced apart from each other by a predetermined interval, and electrically connected to the semiconductor layer 124, respectively. In more detail, a semiconductor layer contact hole through which a part of the semiconductor layer 124 is exposed is formed through the gate insulating layer 115a and the inter-layer insulating layer 115b, such that the source and drain electrodes 122 and 123 can be electrically connected to the semiconductor layer 124.

The source electrode 122 and the data line may be formed in a single body united (or integrated) with each other.

Although the data line, the driving voltage line, the source and drain electrodes 122 and 123 and the upper sustaining electrode 119 are depicted to be formed in a single layer, they may be formed in a multi-layered structure including at least two layers.

Here, the upper sustaining electrode 119 overlaps (or otherwise overlays, super-imposes, covers, encroaches, etc.) a part of the lower sustaining electrode 109 with the inter-layer insulating layer 115b interposed therebetween, thereby forming a storage capacitor.

The data line, the driving voltage line, the source and drain electrodes 122 and 123 and the upper sustaining electrode 119 may be formed into a single layer or a multilayer which is made of a second metallic material having a low resistance characteristic, such as aluminum (Al), copper (Cu), molybdenum (Mo), chrome (Cr), gold (Au), titanium (Ti), nickel (Ni), neodymium (Nd), or alloy thereof.

A passivation layer 115c and a planarization layer 115d are provided on the substrate 110 including the data line, the driving voltage line, the source and drain electrodes 122 and 123 and the upper sustaining electrode 119.

The passivation layer 115c may be formed on the entire surface of the substrate 110 including both of the display area and the pad area. The planarization layer 115d may be formed on the display area in which the TFT is formed.

Next, the OLED may include a first electrode 118, an organic compound layer 130 and a second electrode 128.

The OLED is electrically connected to the driving TFT DT. In more detail, a drain contact hole through which the drain electrode 123 of the driving TFT DT is exposed is formed through the passivation layer 115c and the planarization layer 115d which are located on the driving TFT DT. The OLED is electrically connected to the drain electrode 123 of the driving TFT DT through the drain contact hole.

That is, the first electrode 118 is provided on the planarization layer 115d, and electrically connected to the drain electrode 123 of the driving TFT DT through the drain contact hole.

The first electrode 118 is to supply a current (or a voltage) to the organic compound layer 130, and defines a light-emitting region with a predetermined area (or size).

The first electrode 118 serves as an anode. Accordingly, the first electrode 118 may include a transparent conductive material with a relatively high work function. Also, the first electrode 118 may be formed in a multi-layered structure including a plurality of electrode layers. For example, the first electrode 118 may be formed in a three-layered structure which is prepared by sequentially stacking a first electrode layer 118a, a second electrode layer 118b and third electrode layer 118c. The first electrode layer 118a may increase the adhesive strength of the second electrode layer 118b. The first electrode layer 118a may be formed of Indium Tin Oxide (ITO) or Indium Zinc Oxide (IZO). To improve reflectivity, the second electrode layer 118b may be a reflection layer made of a metal with high reflectivity. Examples of the metal having the high reflectivity may include aluminum (Al), silver (Ag), gold (Au), platinum (Pt), chrome (Cr) or alloy thereof.

The third electrode layer 118c may have a high work function. As such, the first electrode 118 may be used as the anode electrode. Such a third electrode layer 118c may be a transparent conductive layer. For example, the third electrode layer 118c may be formed from ITO or IZO. However, the present invention may not be limited to this.

A bank 115e (or other structure serving a similar purpose) is formed on the substrate 110 having the first electrode 118. Here, the bank 115e defines a first opening by surrounding an edge region of the first electrode 118 like a bank. The bank 115e may be made of an organic or inorganic insulating material. The bank 115e may also be made of a photosensitive material containing black pigments. In this instance, the bank 115e serves as a shielding member.

The bank 115e may be formed to surround edges of the first electrode 118. As such, any corrosion of the edges of the first electrode 118 may be prevented.

Here, in the first embodiment of the present invention, the bank 115e further includes a second opening through which an auxiliary electrode 125 to be explained later is partially exposed.

The organic compound layer 130 is provided between the first electrode 118 and the second electrode 128. The organic compound layer 130 emits light as holes supplied from the first electrode 118 and electrons supplied from the second electrode 128 are coupled to each other.

Here, FIG. 4A illustrates an example that the organic compound layer 130 is formed on an entire surface of the substrate 110. However, the present invention may not be limited to this. The organic compound layer 130 may also be formed on the first electrode 118.

Although it is shown in FIG. 4A that the organic compound layer 130 is formed in a single layer, the organic compound layer 130 is not limited to this. The organic compound layer 130 may have a multi-layered structure including a light-emitting layer to emit light and an auxiliary layer for improving light-emission efficiency of the light-emitting layer.

The second electrode 128 is provided on the organic compound layer 130 to supply electrons to the organic compound layer 130.

The second electrode 128 serves as a cathode. Accordingly, the second electrode 128 may be made of a transparent conductive material. An example of the transparent conductive material may include ITO or IZO. The second electrode 128 may further include a thin metal layer which is provided at a side contactable with the organic compound layer 130 and is formed of a metal with a low work function. Examples of metals with the low work function may include magnesium (Mg), silver (Ag) and compounds thereof.

For the top emission type OLED display device, the second electrode 128 is formed to be relatively thin in thickness in order to meet the requirements of low work function and semi-transmittance. Therefore, the second electrode 128 has increased resistance, which causes a voltage drop (IR drop).

In the first embodiment of the present invention, in order to lower the voltage drop by reducing the resistance of the second electrode 128, an auxiliary electrode line VSSLa is formed on the same layer as the first electrode 118. The auxiliary electrode line VSSLa may include the auxiliary electrode 125 and a barrier wall 135.

The auxiliary electrode 125 and the first electrode 118 are formed on the same layer. The auxiliary electrode 125 is spaced apart from the first electrode 118. For example, the auxiliary electrode 125 may extend along in one direction to be connected to an external VSS pad.

The auxiliary electrode 125 may be implemented as a three-layered structure of a first auxiliary electrode layer 125a, a second auxiliary electrode layer 125b and a third auxiliary electrode layer 125c, which is substantially the same as the structure of the first electrode 118. In this instance, upon depositing the second electrode 128, the second electrode 128 may come in contact directly with the third auxiliary electrode layer 125c of the auxiliary electrode 125. That is, the second electrode 128 is deposited even to a lower portion of the barrier wall 135 so as to come in contact with the auxiliary electrode 125. However, the present invention may not be limited to this.

The barrier wall 135 is located on the auxiliary electrode 125.

Here, the barrier wall 135 may have a reverse tapering shape that its cross-section is reduced from its top to bottom. For example, an angle formed by a side surface of the barrier wall 135 and the auxiliary electrode 125 may be in the range of 20 to 80°. This reverse tapering shape having the angle at the side surface may result in a shading effect to be explained later.

The barrier wall 135 forms an electrode contact hole through the organic compound layer 130 so as to expose the auxiliary electrode 125 therethrough. The organic compound layer 130 is formed on a top of the barrier wall 135, but not formed below the top the barrier wall 135 by the shading effect. That is, the organic compound layer 130 is deposited on the substrate 110 by evaporation with directionality. Here, the organic compound layer 130 is not formed below the top of the barrier wall 140 because of the reverse tapering shape of the barrier wall 135. Accordingly, the electrode contact hole is formed through the organic compound layer 130.

The organic compound layer 130 and the second electrode 128 are sequentially deposited (laminated) on the barrier wall 135.

The pad area is an edge area of the TFT substrate 110 having the display area. The pad area includes a gate pad area and a data pad area.

Referring to FIG. 4B, a gate pad electrode 126p and a data pad electrode 127p which are electrically connected to the gate line and the data line, respectively, are located on the gate pad area and the data pad area. The gate pad electrode 126p and the data pad electrode 127p transfer a scan signal and a data signal applied from an external driving circuit to the gate line and the data line, respectively.

That is, the gate line and the data line extend toward a driving circuit to be connected to corresponding gate pad line 116p and data pad line 117p, respectively. The gate pad line 116p and the data pad line 117p are electrically connected to the gate pad electrode 126p and the data pad electrode 127p through a gate pad line pattern 116p' and a data pad line pattern 117p'. Therefore, the gate line and the data line receive the scan signal and the data signal, respectively, applied from the driving circuit through the gate pad electrode 126p and the data pad electrode 127p.

The gate pad line 116p and the gate line may be formed in a single body united with each other.

Moreover, the gate pad line 116p and the data pad line 117p may be formed through the same process as the gate line and the gate electrode 121.

The data pad line pattern 117p' and the data line may be formed in a single body united with each other.

Also, the gate pad line pattern 116p' and the data pad line pattern 117p' may be formed through the same process as the data line and the source and drain electrodes 122 and 123.

Here, although the gate pad line 116p and the data pad line 117p are formed in a single layer, they may be formed in a multi-layered structure including at least two layers.

A plurality of contact holes exposing the gate pad line 116p and the data pad line 117p may be formed in the inter-layer insulating layer 115b of the pad area. Also, a plurality of contact holes exposing the gate pad line pattern 116p' and the data pad line pattern 117p' may be formed in the passivation layer 115c of the pad area.

Then, the gate pad electrode 126p and the data pad electrode 127p according to the first embodiment of the present invention may have substantially the same three-layered structure as the first electrode 118 and the auxiliary electrode 125 on the display area, for example, the three-layered structure of ITO/Ag alloy/ITO.

That is, the gate pad electrode 126p according to the first embodiment of the present invention may include a first gate pad electrode layer 126pa, a second gate pad electrode layer 126pb and a third gate pad electrode layer 126pc. The data pad electrode 127p may have a three-layered structure of a first data pad electrode layer 127pa, a second data pad electrode layer 127pb and a third data pad electrode layer 127pc.

In the OLED display device according to the first embodiment, when the second electrode layer 118b of the first electrode 118 is formed of Ag or Ag alloy in order to improve reflectivity, the pad electrodes, namely, the gate pad electrode 126p and the data pad electrode 127p also have the structure of ITO/Ag or Ag alloy/ITO. Here, in the first embodiment, as the first pad electrode layers 126pa and 127pa made of ITO is located on the second pad electrode layers 126pb and 127pb, the corrosion of Ag or Ag due to an external moisture and oxygen may be prevented to some extent.

However, as sides of the second pad electrode layers 126pb and 127pb are exposed to an outside, the corrosion of Ag or Ag by an etchant during patterning of the first electrode 118 may occur. Thus there is a possibility of short-circuit problems with an adjacent line. Thus, the corrosion of the pad electrode 126p and 127p causes improper signal transfer from a driver driving circuit and may cause defects in the OLED display device.

Accordingly, in a second embodiment of the present invention, pad electrodes may be formed on a layer of a data line, and sides of the second pad electrode layers may be sealed by using a passivation layer (or of some other appropriate material or layer). Also, a three-layered structure of MoTi/Cu/MoTi having a particular etch selectivity with respect to an etchant used for etching Ag or Ag alloy may be applied to the pad electrodes of a pad area. This may result in preventing damage on the pad electrodes due to the etchant during patterning of a first electrode. Hereinafter, the second embodiment of the present invention will be described in detail with reference to the accompanying drawing.

Here, when the different kinds of the films are etched by the same etchant, etch selectivity results in one thin film being not etched and another thin film being etched. In other words, the film that may be etched has no etch selectivity, and the thin film that is not etched has etch selectivity.

Therefore, there are etching selectivity between Cu that may be etched by an etchant used for etching Ag or Ag alloy and MoTi that is not etched by the etchant. That is, it is possible to avoid damage to the pad electrodes by the etchant during patterning of the first electrode by employing a three-layered structure of a MoTi/Cu/MoTi having etch selectivity to the pad electrodes of the pad area.

Figure 5A:
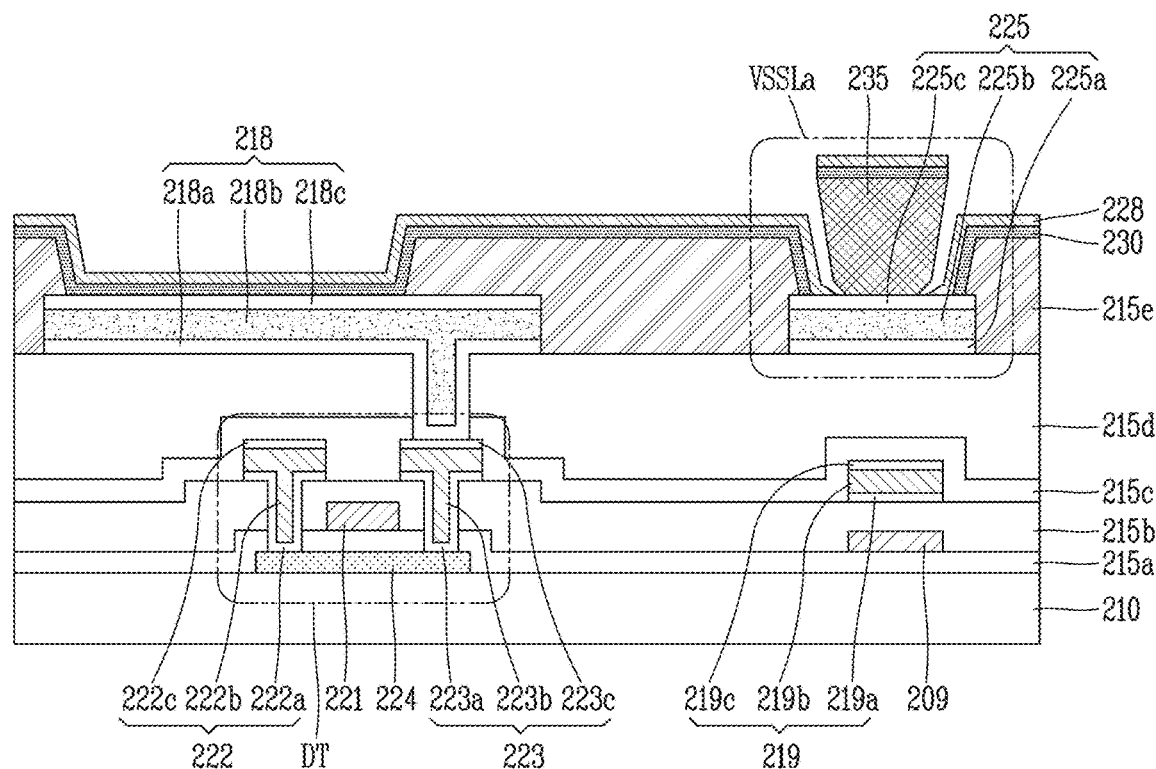
FIGS. 5A and 5B are sectional views schematically illustrating a partial structure of an OLED display device in accordance with a second embodiment of the present invention.
Figure 5B:
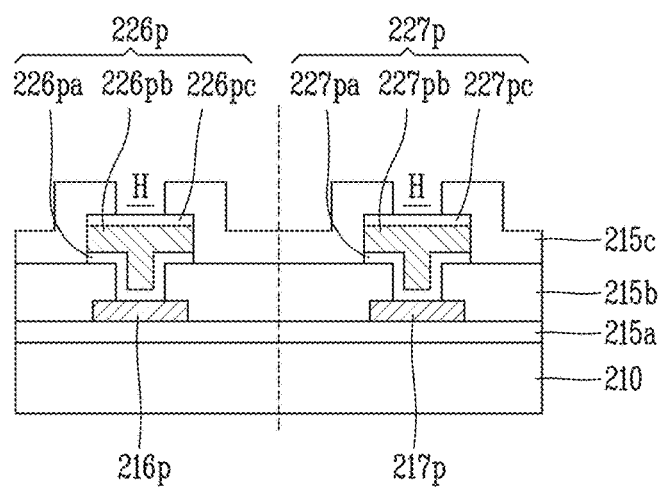

FIGS. 5A and 5B are sectional views schematically illustrating a partial structure of an OLED display device in accordance with a second embodiment of the present invention.

Here, FIG. 5A illustrates one exemplary sub pixel including a TFT part and a capacitor forming part of an OLED display device, and FIG. 5B sequentially illustrates parts of a gate pad area and a data pad area.

Specifically, FIG. 5A illustrates one exemplary sub pixel of a top emission type OLED display device using a coplanar TFT, but the present invention may not be limited to the coplanar TFT.

Referring to FIG. 5A, the top emission type OLED display device according to the second embodiment of the present invention includes a substrate 210, a driving TFT DT, an OLED and an auxiliary electrode line VSSLa. But it is not limited to this. The present invention may not include the auxiliary electrode line VSSLa.

First, as the same as the first embodiment, the driving TFT DT includes a semiconductor layer 224, a gate electrode 221, a source electrode 222 and a drain electrode 223.

The semiconductor layer 224 is formed on a substrate 210 which is made of an insulating material, such as silicon Si, glass, transparent plastic or a polymer film. But it is not limited to this. In other words, the substrate 210 may be formed from any material capable of supporting pluralities of layers and elements.

The semiconductor layer 224 may be made of amorphous silicon or polycrystalline silicon with crystallized amorphous silicon.

Here, a buffer layer may further be located between the substrate 210 and the semiconductor layer 224. The buffer layer may be formed to protect the TFT from impurities such as alkaline ion discharged from the substrate 210 during crystallization of the semiconductor layer 224.

A gate insulating layer 215a which is made of silicon nitride (SiNx) or silicon dioxide ($SiO_2$) is formed on the semiconductor layer 224, and a gate line including the gate electrode 221 and a lower sustaining electrode 209 are formed on the gate insulating layer 215a.

The gate insulating layer 215a may be formed in the display area and the pad area. In other words, the gate insulating layer 215a may be formed on the entire surface of the substrate 210 provided with the semiconductor layer 224. But it is not limited to this.

The gate electrode 221 may be formed in such a manner as to overlap with the semiconductor layer 224 within the display area.

The gate electrode 221 and the gate line may be formed in a single body united with each other.

The gate electrode 221, the gate line and the lower sustaining electrode 209 may be formed into a single layer or a multilayer made of a first metallic material having a low resistance characteristic, such as aluminum (Al), copper (Cu), molybdenum (Mo), chrome (Cr), gold (Au), titanium (Ti), nickel (Ni), neodymium (Nd), or alloy thereof.

Although the gate electrode 221, the gate line and the lower sustaining electrode 209 are formed in a single layer, they may be formed in a multi-layered structure including at least two layers.

An inter-layer insulating layer 215b which is made of silicon nitride or silicon dioxide is provided on the gate electrode 221, the gate line and the lower sustaining electrode 209. On the inter-layer insulating layer 215b are provided a data line, a driving voltage line, source and drain electrodes 222 and 223 and a upper sustaining electrode 219.

Also, a plurality of contact holes may be formed in the inter-layer insulating layer 215b.

The source electrode 222 and the drain electrode 223 are spaced apart from each other by a predetermined interval, and electrically connected to the semiconductor layer 224. In more detail, a semiconductor layer contact hole through which the semiconductor layer 224 is exposed is formed through the gate insulating layer 215a and the inter-layer insulating layer 215b, such that the source and drain electrodes 222 and 223 are electrically connected to the semiconductor layer 224.

The source electrode 222 and the data line may be formed in a single body united with each other.

Here, the upper sustaining electrode 219 overlaps a part of the lower sustaining electrode 209 with the inter-layer insulating layer 215b interposed therebetween, thereby forming a storage capacitor.

Here, the data line, the driving voltage line, the source and drain electrodes 222 and 223 and the upper sustaining electrode 219 according to the second embodiment of the present invention may have a multi-layered structure with three layers or more.

That is, the source electrode 222 may have a three-layered structure of a first source electrode layer 222a, a second source electrode layer 222b and a third source electrode layer 222c, and the drain electrode 223 may have a three-layered structure of a first drain electrode layer 223a, a second drain electrode layer 223b and a third drain electrode layer 223c.

The upper sustaining electrode 219 may also have a three-layered structure of a first upper sustaining electrode layer 219a, a second upper sustaining electrode layer 219b and a third upper sustaining electrode layer 219c.

The first source electrode layer 222a, the first drain electrode layer 223a and the first upper sustaining electrode layer 219a may be formed from the same material. Also, the first source electrode layer 222a, the first drain electrode layer 223a and the first upper sustaining electrode layer 219a may increase adhesive strengths of the second source electrode layer 222b, the second drain electrode layer 223b and the second upper sustaining electrode layer 219b.

For example, the first source electrode layer 222a, the first drain electrode layer 223a and the first upper sustaining electrode layer 219a may be formed from one of molybdenum titanium MoTi, titanium Ti and an alloy thereof.

The second source electrode layer 222b, the second drain electrode layer 223b and the second upper sustaining electrode layer 219b may be formed from the same material. Also, the second source electrode layer 222b, the second drain electrode layer 223b and the second upper sustaining electrode layer 219b may be formed from a low resistive material. For example, the second source electrode layer 222b, the second drain electrode layer 223b and the second upper sustaining electrode layer 219b may be formed from one selected from a material group which includes aluminum Al, tungsten W, copper Cu, silver Ag, molybdenum Mo, chromium Cr, tantalum Ta, titanium Ti, or alloys thereof. Preferably, the second source electrode layer 222b, the second drain electrode layer 223b and the second upper sustaining electrode layer 219b may be formed from copper Cu.

The third source electrode layer 222c, the third drain electrode layer 223c and the third upper sustaining electrode layer 219c may be formed from the same material. Also, the third source electrode layer 222c, the third drain electrode layer 223c and the third upper sustaining electrode layer 219c may be formed from a material which is not corroded by moisture and oxygen in spite of being exposed to the exterior. For example, the third source electrode layer 222c, the third drain electrode layer 223c and the third upper sustaining electrode layer 219c may be formed from one of molybdenum titanium MoTi, titanium Ti or an alloy thereof.

For example, the data wiring according to the second embodiment of the present invention may have a three-layered structure of MoTi/Cu/MoTi.

A passivation layer 215c and a planarization layer 215d are provided on the substrate 210 having data line, the driving voltage line, the source and drain electrodes 222 and 223 and the upper sustaining electrode 219. The passivation layer 215c may be formed on the entire surface of the substrate 210 including both of the display area and the pad area. The planarization layer 215d may be formed on the display area in which the TFT is formed.

Next, the OLED may include a first electrode 218, an organic compound layer 230 and a second electrode 228.

The OLED is electrically connected to the driving TFT DT. In more detail, a drain contact hole through which the drain electrode 223 of the driving TFT DT is exposed is formed through the passivation layer 215c and the planarization layer 215d which are located on the driving TFT DT.

That is, the first electrode 218 is provided on the planarization layer 215d, and electrically connected to the drain electrode 223 of the driving TFT DT through the drain contact hole.

The first electrode 218 is to supply a current (or a voltage) to the organic compound layer 230, and defines a light-emitting region with a predetermined area (or size).

The first electrode 218 serves as an anode. Accordingly, the first electrode 218 may include a transparent conductive material with a relatively high work function. Also, the first electrode 218 may be formed in a multi-layered structure including a plurality of electrode layers. For example, the first electrode 218 may be formed in a three-layered structure which is prepared by sequentially stacking a first electrode layer 218a, a second electrode layer 218b and third electrode layer 218c.

The first electrode layer 218a may increase the adhesive strength of the second electrode layer 218b. The first electrode layer 218a may be formed of Indium Tin Oxide (ITO) or Indium Zinc Oxide (IZO). To improve reflectivity, the second electrode layer 218b may be a reflection layer made of a metal with high reflectivity. Examples of the metal having the high reflectivity may include aluminum (Al), silver (Ag), gold (Au), platinum (Pt), chrome (Cr) or alloy thereof.

The third electrode layer 218c may have a high work function. As such, the first electrode 218 may be used as the anode electrode. Such a third electrode layer 218c may be a transparent conductive layer. For example, the third electrode layer 218c may be formed from ITO or IZO. However, the present invention may not be limited to this.

A bank 215e is formed on the substrate 210 having the first electrode 218. Here, the bank 215e defines a first opening by surrounding an edge of the first electrode 218 like a bank. The bank 215e may be made of an organic or inorganic insulating material. The bank 215e may also be made of a photosensitive material containing black pigments. In this instance, the bank 215e serves as a shielding member.

The bank 215e may be formed to surround edges of the first electrode 218. As such, any corrosion of the edges of the first electrode 218 may be prevented.

Here, in the second embodiment of the present invention, the bank 215e further include a second opening through which an auxiliary electrode 225 to be explained later is partially exposed.

The organic compound layer 230 is provided between the first electrode 218 and the second electrode 228. The organic compound layer 230 emits light as holes supplied from the first electrode 218 and electrons supplied from the second electrode 228 are coupled to each other.

Here, FIG. 5A illustrates an example that the organic compound layer 230 is formed on an entire surface of the substrate 210. However, the present invention may not be limited to this. The organic compound layer 230 may also be formed on the first electrode 218.

Although it is shown in FIG. 5A that the organic compound layer 230 is formed in a single layer, the organic compound layer 230 is not limited to this. The organic compound layer 230 may have a multi-layered structure including a light-emitting layer to emit light and an auxiliary layer for improving light-emission efficiency of the light-emitting layer.

The second electrode 228 is formed on the organic compound layer 230 to supply electrons to the organic compound layer 230.

The second electrode 228 serves as a cathode. Accordingly, the second electrode 228 may be made of a transparent conductive material. An example of the transparent conductive material may include ITO or IZO. The second electrode 228 may further include a metal layer which is provided at a side contactable with the organic compound layer 230 and is formed of a metal with a low work function. Examples of the metal with the low work function may include magnesium (Mg), silver (Ag) or a compound thereof.

As the same as the first embodiment of the present invention, an auxiliary electrode line VSSLa and the first electrode 218 are provided on the same layer to reduce resistance of the second electrode 228. Here, the auxiliary electrode line VSSLa includes the auxiliary electrode 225 and the barrier wall 235.

The auxiliary electrode 225 and the first electrode 218 are formed on the same layer. The auxiliary electrode 225 is spaced apart from the first electrode 218. For example, the auxiliary electrode 225 may extend long in one direction to be connected to an external VSS pad.

The auxiliary electrode 225 may be implemented into a three-layered structure of a first auxiliary electrode layer 225a, a second auxiliary electrode layer 225b and a third auxiliary electrode layer 225c, as substantially the same as the structure of the first electrode 218. In this instance, upon depositing the second electrode 228, the second electrode 228 may come in contact directly with the third auxiliary electrode layer 225c of the auxiliary electrode 225. That is, the second electrode 228 is deposited even to a lower portion of the barrier wall 235 so as to come in contact with the auxiliary electrode 225. However, the present invention may not be limited to this.

The barrier wall 235 is located on the auxiliary electrode 225.

Here, the barrier wall 235 may have a tapering shape that its cross-section is reduced from its top to bottom. For example, an angle formed by a side surface of the barrier wall 235 and the auxiliary electrode 225 may be in the range of 20 to 80°. This reverse tapering shape having the angle at the side surface may derive a shading effect to be explained later.

The barrier wall 235 forms an electrode contact hole through the organic compound layer 230 so as to expose the auxiliary electrode 225 therethrough. The organic compound layer 230 is formed on a top of the barrier wall 235, but not formed below the barrier wall 235 by the shading effect. Accordingly, the electrode contact hole is formed through the organic compound layer 230.

The organic compound layer 230 and the second electrode 228 are sequentially stacked (laminated) on the barrier wall 235.

The pad area is an edge area of the TFT substrate 210 having the display area. The pad area includes a gate pad area and a data pad area.

Referring to FIG. 5B, a gate pad electrode 226p and a data pad electrode 227p which are electrically connected to a gate line and a data line, respectively, are located on the gate pad area and the data pad area. The gate pad electrode 226p and the data pad electrode 227p transfer a scan signal and a data signal applied from an external driving circuit to the gate line and the data line, respectively.

That is, the gate line and the data line extend toward the driving circuit to be connected to corresponding gate pad line 216p and data pad line 217p, respectively. The gate pad line 216p and the data pad line 217p are electrically connected to the gate pad electrode 226p and the data pad electrode 227p, respectively. Therefore, the gate line and the data line receive the scan signal and the data signal, respectively, from the driving circuit through the gate pad electrode 226p and the data pad electrode 227p.

The gate pad line 216p and the gate line may be formed in a single body united with each other.

Moreover, the gate pad line 216p and the data pad line 217p may be formed through the same process as the gate line and the gate electrode 221.

The data pad electrode 227p and the data line may be formed in a single body united with each other.

Also, the gate pad electrode 226p and the data pad electrode 227p may be formed through the same process as the data line and the source and drain electrodes 222 and 223.

Here, although the gate pad line 216p and the data pad line 217p are formed in a single layer, they may be formed in a multi-layered structure including at least two layers.

A plurality of contact holes exposing the gate pad line 216p and the data pad line 217p may be formed in the inter-layer insulating layer 215b of the pad area. Also, an open hole H exposing the gate pad electrode 226p and the data pad electrode 227p may be formed in the passivation layer 215c of the pad area.

Then, the gate pad electrode 226p and the data pad electrode 227p according to the second embodiment of the present invention are formed on the same layer as the data line of the display area, here have substantially the same three-layered structure as the data line, for example, the three-layered structure of MoTi/Cu/MoTi.

That is, in the second embodiment of the present invention, the three-layered structure of MoTi/Cu/MoTi having etch selectivity with respect to an etchant for etching Ag or Ag alloy is applied to the gate pad electrode 226p and the data pad electrode 227p of the pad area, and also parts of the gate pad electrode 226p and the data pad electrode 227p are externally exposed by forming an open hole H during patterning of the passivation layer 215c.

In this instance, the upper MoTi may serve as an etch stopper of the etchant for etching Ag or Ag alloy.

Here, the gate pad electrode 226p according to the second embodiment of the present invention may have the three-layered structure of a first gate pad electrode layer 226pa, a second gate pad electrode layer 226pb and a third gate pad electrode layer 226pc, and the data pad electrode 227p may have the three-layered structure of a first data pad electrode layer 227pa, a second data pad electrode layer 227pb and a third data pad electrode layer 227pc.

The lowermost layers, i.e. the first gate pad electrode layer 226pa and the first data pad electrode layer 227pa may be an adhesion promoting layer increasing the adhesive strength of the second gate pad electrode layer 226pb and the second data pad electrode layer 227pb. That is, the first gate pad electrode layer 226pa may be made of a material configured so as to increase the adhesion between the second gate pad electrode layer 226pb and a fourth pad electrode layer, i.e. the gate pad line 216p. Also, the first data pad electrode layer 227pa may be made of a material configured so as to increase the adhesion between the second data pad electrode layer 227pb and the data pad line 217p.

The second gate pad electrode layer 226pb and the second data pad electrode layer 227pb may be formed from a low resistive material compared with the first gate pad electrode layer 226pa, the first data pad electrode layer 227pa and the third gate pad electrode layer 226pc, the third data pad electrode layer 227pc.

The pad electrodes 226p and 227p must be externally exposed for the connection with an external driver later. The pad electrodes 226p and 227p formed from copper Cu or others can be easy to transfer signals because of their low resistance. Meanwhile, the exposed pad electrodes 226p and 227p may be corroded by external moisture and oxygen. Moreover, the pad electrodes 226p and 227p formed from copper Cu or others can be etched by the etchant for patterning the first electrode 218 at the formation of the first electrode 218 which is performed for the formation of the OLED later.

To address this matter, the uppermost third pad electrode layers 226pc and 227pc may be formed from a material which is not corroded by oxygen and moisture, even though they are externally exposed. In other words, the third pad electrode layers 226pc and 227pc may be formed from a material being not etched by an etchant which may be used to form the first electrode 218. For example, the third pad electrode layers 226pc and 227pc may be formed from one of molybdenum titanium MoTi, titanium Ti or an alloy thereof.

Also, the passivation layer 215c may be formed in such a manner as to expose upper surfaces of the third pad electrode layers 226pc and 227pc of the pad electrodes 226p and 227p. In other words, the passivation layer 215c may be formed in such a manner as to surround edges of the upper surfaces of the pad electrodes 226p and 227p. As such, any corrosion of the sides of the pad electrodes 226p and 227p may be prevented. For example, the passivation layer 215c may be formed in such a manner as to cover sides of the first pad electrode layers 226pc and 227pa, the second pad electrode layers 226pb and 227pb and the third pad electrode layers 226pc and 227pc, and at least some portions of the upper surfaces of the third pad electrode layers 226pc and 227pc.

Hereinafter, a method of fabricating an OLED display device according to the second embodiment of the present invention having the configuration will be described in detail with reference to the accompanying drawings.

FIGS. 6A to 6J are sectional views sequentially illustrating a method of fabricating the OLED display device according to the second embodiment illustrated in FIG. 5A, which sequentially illustrates a method of fabricating a TFT substrate of a display area.

And, FIGS. 7A to 7G are sectional views sequentially illustrating a method of fabricating the OLED display device according to the second embodiment illustrated in FIG. 5B, which sequentially illustrates a method of fabricating a TFT substrate of a pad area.

Figure 6A:
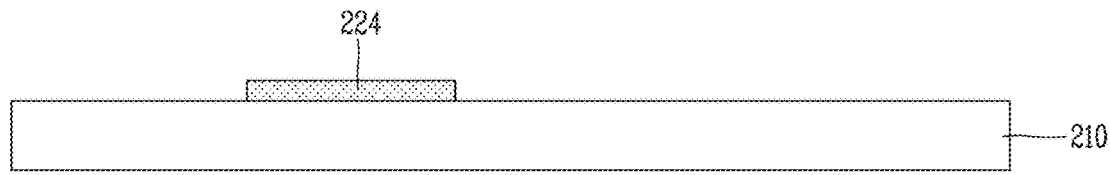
FIGS. 6A to 6J are sectional views sequentially illustrating a method of fabricating the OLED display device according to the second embodiment illustrated in FIG. 5A.
Figure 7A:
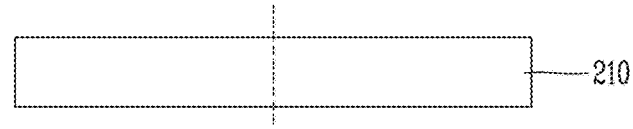
FIGS. 7A to 7G are sectional views sequentially illustrating a method of fabricating the OLED display device according to the second embodiment illustrated in FIG. 5B.

As illustrated in FIGS. 6A and 7A, a substrate 210 which is made of an insulating material, such as a transparent glass material, transparent plastic with high flexibility, a polymer film or the like is provided.

Although not illustrated, a TFT and a storage capacitor are formed on each of red, green and blue sub pixels of the substrate 210.

First, a buffer layer is formed on the substrate 210.

Here, the buffer layer may be formed to protect the TFT from impurities such as alkaline ion discharged from the substrate 110 during crystallization of a semiconductor layer. The buffer layer may be made of silicon dioxide.

Next, a semiconductor thin film is formed on the substrate 210 having the buffer layer.

The semiconductor thin film may be made of amorphous silicon, polycrystalline silicon, or oxide semiconductor.

Here, the polycrystalline silicon may be generated by employing various crystallization methods after depositing amorphous silicon on the substrate 210. When the oxide semiconductor is used as the semiconductor thin film, the oxide semiconductor may be deposited, followed by a predetermined thermal treatment therefor.

Afterwards, the semiconductor thin film is selectively removed through a photolithography process to form a semiconductor layer 224, which is formed of the semiconductor thin film, on the substrate 210 of the display area.

Figure 6B:
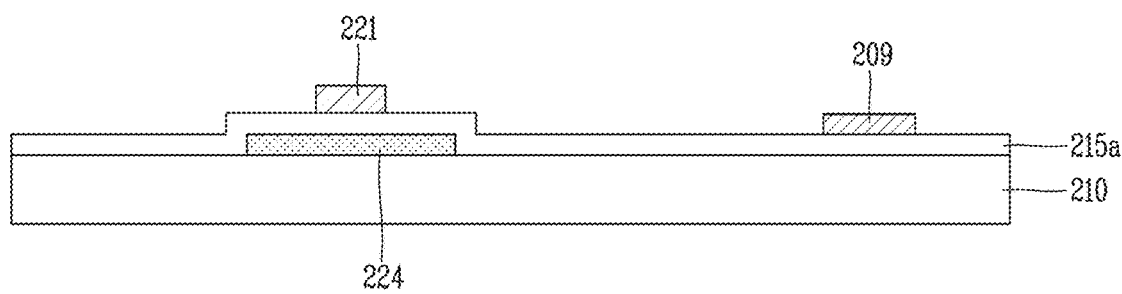
Figure 7B:
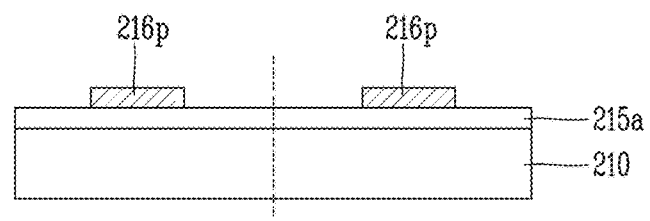

As illustrated in FIGS. 6B and 7B, a gate insulating layer 215a and a first conductive layer are formed on the substrate 210 having the semiconductor layer 224.

The gate insulating layer 215a may be formed on the entire surface of the substrate 210 provided with the semiconductor layer 224.

The first conductive layer may be provided to form a gate line, and made of a low-resistant opaque conductive material, such as aluminum (Al), copper (Cu), molybdenum (Mo), chrome (Cr), gold (Au), titanium (Ti), nickel (Ni), neodymium (Nd) or alloy thereof. However, these materials may have a multi-layered structure including two conductive layers which exhibit different physical properties. One of the conductive layers may be made of a metal with low resistivity, for example, aluminum-based metal, silver-based metal, copper-based metal or the like, so as to reduce a signal delay or a voltage drop.

Afterwards, the first conductive layer is selectively removed through the photolithography process. Accordingly, a gate line including a gate electrode 221, which is made of the first conductive layer, and a lower sustaining electrode 209 are formed on the substrate 210 of the display area, and also a gate pad line 216p and a data pad line 217p, which are formed of the first conductive layer, are formed on the substrate 210 on a pad area.

The gate electrode 221 may be formed in such a manner as to overlap with the semiconductor layer 224 within the display area.

The gate pad line 216p and the gate line may be formed in a single body united with each other.

Although the gate electrode 221, the gate line, the lower sustaining electrode 209 and the gate pad line 216p are formed in a single layer, they may be formed in a multi-layered structure including at least two layers.

However, the present invention may not be limited to this. The gate line including the semiconductor layer 224 and the gate electrode 221, the lower sustaining electrode 209, the gate pad line 216p and the data pad line 217p may be simultaneously formed through one photolithography process.

Also, the lower gate insulating layer 215a may also be patterned together during patterning of the gate line having the gate electrode 221, the lower sustaining electrode 209, the gate pad line 216p and the data pad line 217p.

Figure 6C:
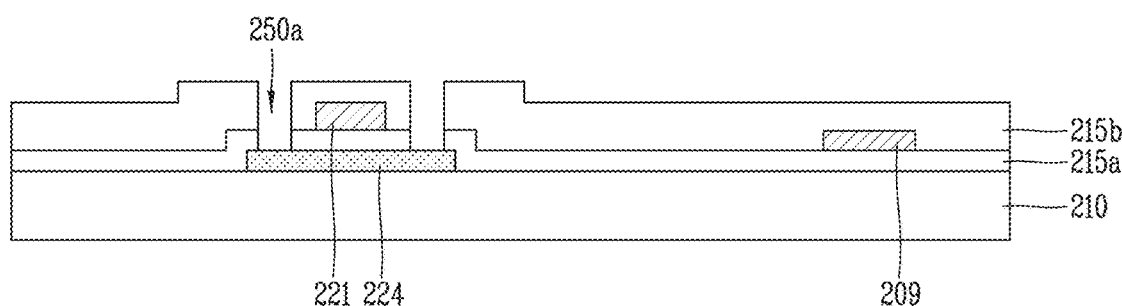
Figure 7C:
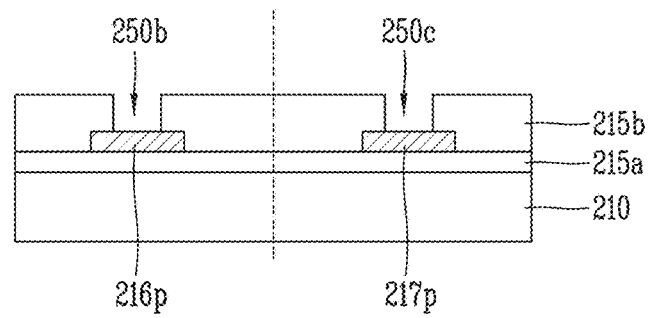

Next, as illustrated in FIGS. 6C and 7C, an inter-layer insulating layer 215b, which is made of silicon nitride or silicon dioxide is formed on the entire surface of the substrate 210 having the gate line having the gate electrode 221, the lower sustaining electrode 209, the gate pad line 216p and the data pad line 217p.

The inter-layer insulating layer 215b may be formed on entire surface of the substrate 210.

The inter-layer insulating layer 215b and the gate insulating layer 215a are selectively patterned through the photolithography. Accordingly, a first contact hole 250a is formed such that a source/drain area of the semiconductor layer 224 is exposed therethrough, and also a second contact hole 250b and a third contact hole 250c are formed, respectively, such that parts of the gate pad line 216p and the data pad line 217p are exposed therethrough.

Figure 6D:
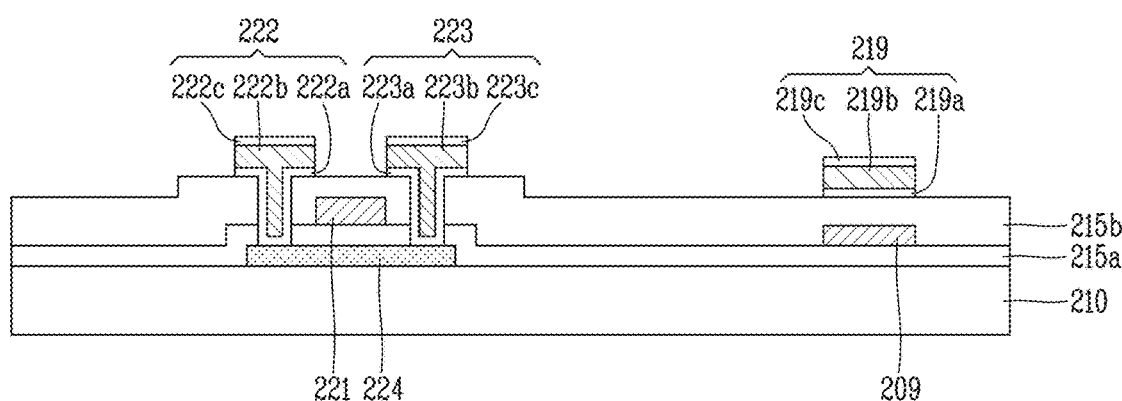
Figure 7D:
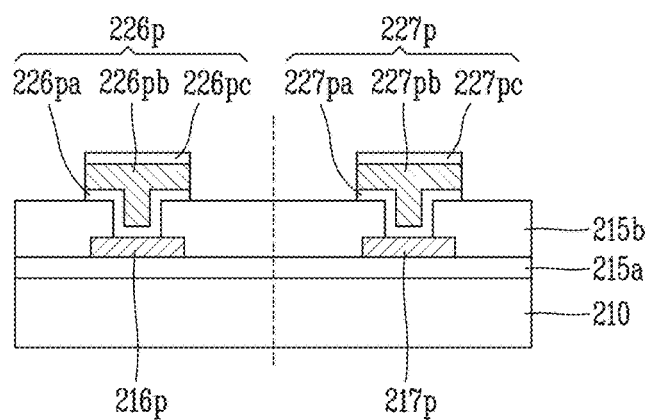

As illustrated in FIGS. 6D and 7D, after forming a second conductive layer, a third conductive layer and a fourth conductive layer on the entire surface of the substrate 210 having the inter-layer insulating layer 215b, the second, third and fourth conductive layers are selectively removed through the photolithography process, thereby forming on the substrate 210 of the display area a data wiring (namely, source and drain electrodes 222 and 223, a driving voltage line, a data line and an upper sustaining electrode 219), which is made of the second, third and fourth conductive layers. That is, the data wiring may be formed in a multi-layered structure. For example, the data wiring may be formed in a three-layered structure.

The source electrode 222 may include a first source electrode layer 222a, a second source electrode layer 222b and a third source electrode layer 222c. The drain electrode 223 may include a first drain electrode layer 223a, a second drain electrode layer 223b and a third drain electrode layer 223c. The upper sustaining electrode 219 may include a upper sustaining electrode layer 219a, a second upper sustaining electrode layer 219b and a third upper sustaining electrode layer 219c.

Simultaneously, on the substrate 210 of the pad area is formed pad electrodes (namely, a gate pad electrode 226p and a data pad electrode 227p), which is made of the second, third and fourth conductive layers.

The gate pad electrode 226p may include a first gate pad electrode layer 226pa, a second gate pad electrode layer 226pb and a third gate pad electrode layer 226pc.

The data pad electrode 227p may include a first data pad electrode layer 227pa, a second data pad electrode layer 227pb and a third data pad electrode layer 227pc.

Here, the third conductive layer is made of a low-resistant opaque conductive material, such as aluminum (Al), copper (Cu), molybdenum (Mo), chrome (Cr), gold (Au), titanium (Ti), nickel (Ni), neodymium (Nd), or alloy thereof, in order to form the middle data line and pad electrode. However, these may have a multi-layered structure including two conductive layers which exhibit different physical properties. Specifically, in the second embodiment of the present invention, the third conductive layer may be made of Cu that can be etched by an etchant for etching Ag or Ag alloy.

Also, the second conductive layer may be made of MoTi in order to form the lower data line and the lower pad electrode. However, the present invention may not be limited to this. The second conductive layer may also be made of any other material if it can increase a contact characteristic with a lower layer. For example, the second conductive layer may be formed from one of molybdenum titanium MoTi, titanium Ti or an alloy thereof.

Here, the fourth conductive layer may be made of molybdenum titanium MoTi, titanium Ti or an alloy thereof in order to form the upper data line and pad electrode. However, the present invention may not be limited to this. The fourth conductive layer may also be made of any other material if it can be used as an etch stopper of an etchant for etching Ag or Ag alloy and may not be corroded by external moisture and oxygen. For example, the fourth conductive layer may be formed from one of molybdenum titanium MoTi, titanium Ti or an alloy thereof.

In this manner, a source electrode 222 which has a three-layered structure of the first source electrode layer 222a, the second source electrode layer 222b and the third source electrode layer 222c, and a drain electrode 223 which has a three-layered structure of the first drain electrode layer 223a, the second drain electrode layer 223b and the third drain electrode layer 223c may be formed on the substrate 210 of the display area.

Also, a upper sustaining electrode 219, which has a three-layered structure of the first upper sustaining electrode layer 219a, the second upper sustaining electrode layer 219b and the third upper sustaining electrode layer 219c may be formed on the lower sustaining electrode 209.

Simultaneously, a gate pad electrode 226p which has a three-layered structure of the first gate pad electrode layer 226pa, the second gate pad electrode layer 226pb and the third gate pad electrode layer 226pc, and a data pad electrode 227p which has a three-layered structure of the first data pad electrode layer 227pa, the second data pad electrode layer 227pb and the third data pad electrode layer 227pc may be formed on the substrate 210 of the pad area.

Here, the data wiring and the pad electrode according to the second embodiment of the present invention may have the three-layered structure of MoTi/Cu/MoTi.

Here, the source and drain electrodes 222 and 223 are electrically connected to the source/drain area of the semiconductor layer 224 through the first contact hole. The upper sustaining electrode 219 overlaps a part of the lower sustaining electrode 209 with interposing the inter-layer insulating layer 215b therebetween, thereby forming a storage capacitor.

The gate pad electrode 226p and the data pad electrode 227p are electrically connected to the lower gate pad line 216p and data pad line 217p through the second and third contact holes, respectively.

Figure 6E:
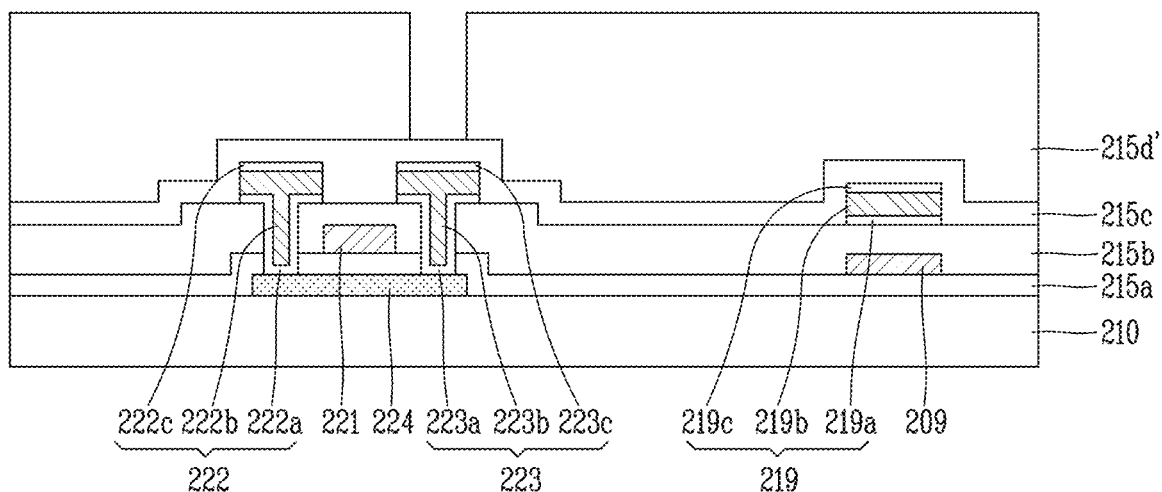
Figure 7E:
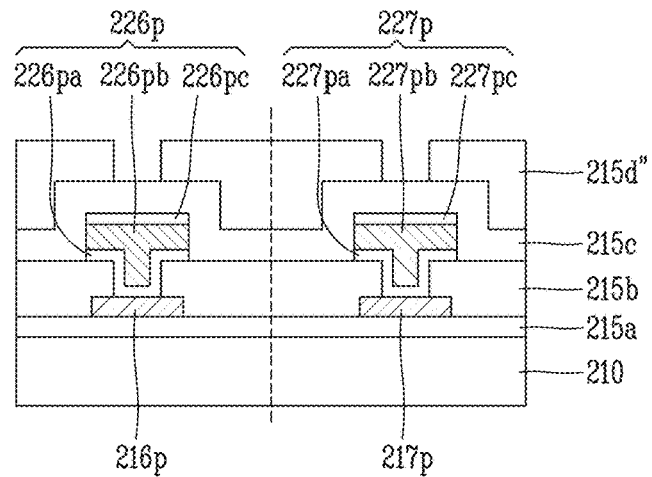

Afterwards, as illustrated in FIGS. 6E and 7E, a passivation layer 215c which is made of silicon nitride or silicon dioxide is formed on the substrate 210 of the display area on which the source and drain electrodes 222 and 223, the driving voltage line, the data line, the upper sustaining electrode 219, the gate pad electrode 226p and the data pad electrode 227p are formed.

The passivation layer 215c may be formed on the entire surface of the substrate 210.

Here, a planarization layer 215d made of an organic insulating material may be formed on the passivation layer 215c, but the present invention may not be limited to this. The passivation layer may also function as the planarization layer.

Such the planarization layer may be formed using one of a halftone mask and a refractive mask. In this case, an insulation layer having a first planarization pattern 215d' with the large thickness and a second planarization pattern 215d'' with the small thickness may be formed on the entire surface of the substrate 210. In other words, the first planarization pattern 215d' may be formed to have a larger height than that of the second planarization pattern 215d''.

The first planarization pattern 215d' with the large thickness may be formed in the display area, and the second planarization pattern 215d'' with the small thickness may be formed in the pad area.

Figure 6F:
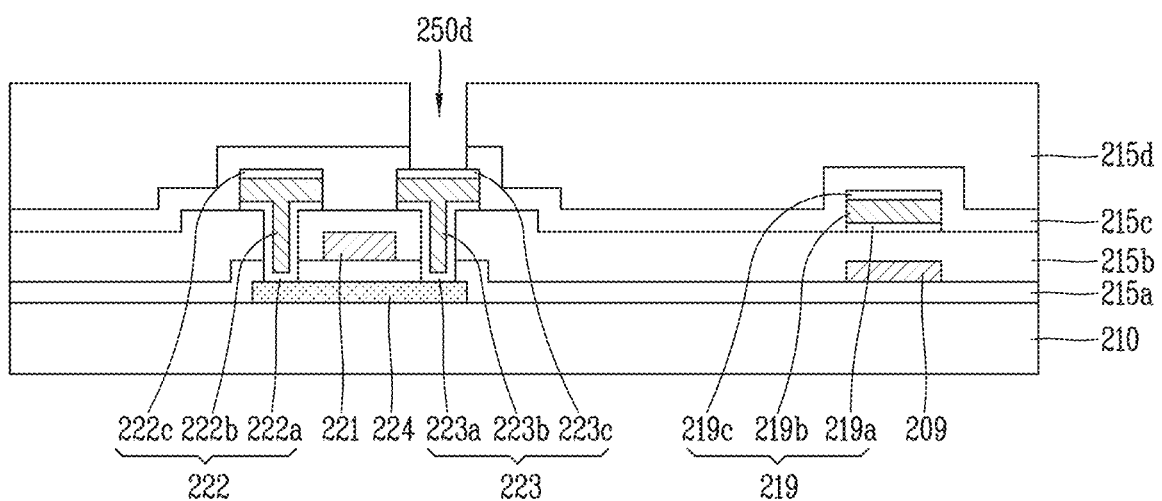
Figure 7F:
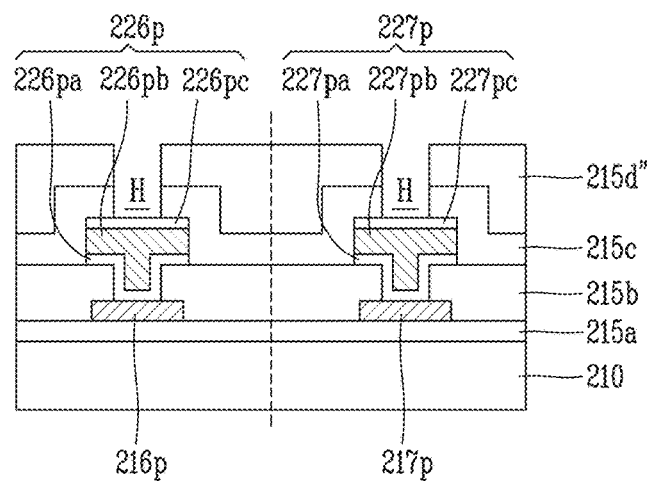

Then, as illustrated in FIGS. 6F and 7F, the passivation patterns 215d' and 215d'' are selectively patterned through the photolithography process, thereby forming a fourth contact hole 250d through which the drain electrode 223 is exposed, and an open hole H through which parts of the gate pad electrode 226p and the data pad electrode 227p are externally exposed.

Figure 7G:
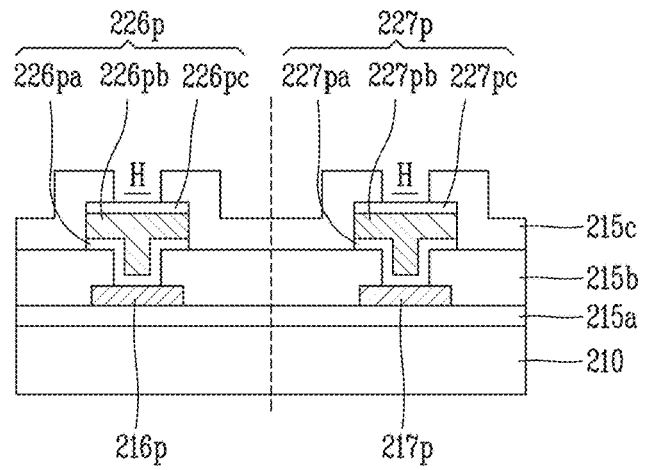

As illustrated in FIGS. 6F and 7G, the second planarization pattern 215d" with the small thickness is removed. At the same time, the first planarization pattern 215d' with the large thickness is removed by the thickness of the second planarization pattern 215d", thereby forming a planarization layer 215d. In other words, when an ashing process is performed for the first planarization pattern 215d' with the large thickness can remain even though the second planarization pattern 215d" with the small thickness is completely removed.

The first planarization pattern 215d' remaining after the ashing process may become the planarization layer 215d. As such, the planarization layer 215d may be formed in the display area without the pad area. In accordance therewith, the passivation layer 215c within the pad area may be exposed.

Figure 6G:
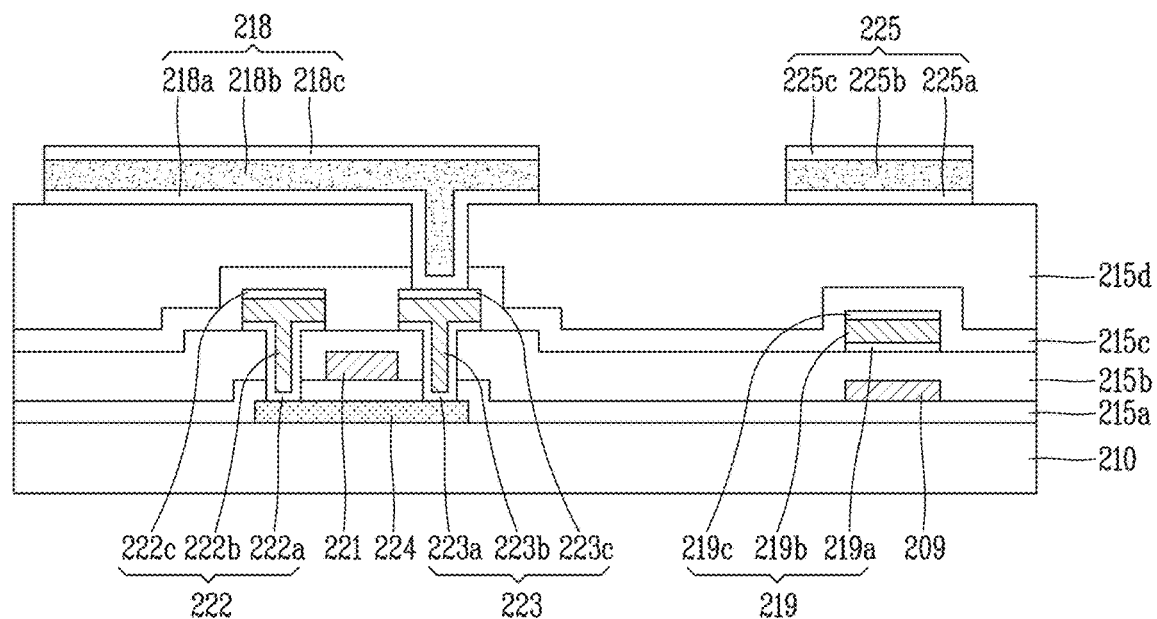

Next, as illustrated in FIG. 6G, fifth to seventh conductive layers are formed on the entire surface of the substrate 210 having the planarization layer 215d.

However, the present invention may not be limited to this. For example, the fifth conductive layer may also be formed as a single layer on the entire surface of the substrate 210 having the planarization layer 215d.

The fifth conductive layer and the seventh conductive layer may be made of a transparent conductive material, such as ITO or IZO.

The sixth conductive layer may be made of aluminum (Al), silver (Ag), gold (Au), platinum (Pt), chrome (Cr) or alloy thereof.

Afterwards, by selectively patterning the fifth to seventh conductive layers through the photolithography process, a first electrode 218 and an auxiliary electrode 225 made of the fifth to seventh conductive layers are formed.

Here, the first electrode 218 may include a first electrode layer 218a, a second electrode layer 218b and a third electrode layer 218c which are made of the fifth to seventh conductive layers, respectively.

The first electrode layer 218a may increase the adhesive strength of the second electrode layer 118b. For example, the first electrode layer 218a may be formed of Indium Tin Oxide (ITO) or Indium Zinc Oxide (IZO).

The second electrode layer 218b may be a reflection layer made of a metal with high reflectivity.

The third electrode layer 218c may have a high work function. As such, the first electrode 218 may be used as the anode electrode. Such a third electrode layer 218c may be a transparent conductive layer. For example, the third electrode layer 218c may be formed from ITO or IZO.

If the gate pad electrode 226p and the data pad electrode 227p are externally exposed at the formation of the first electrode 218, the gate pad electrode 226p and the data pad electrode 227p must be affected by an etchant for the first electrode 218. However, the third gate pad electrode layer 226pc and the third data pad electrode layer 227pc made of molybdenum titanium MoTi, titanium Ti or an alloy thereof, cannot be etched by the etchant for etching Ag or Ag alloy at the patterning of the first electrode 218.

In order to pattern the first electrode 218 formed of an Ag alloy, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+acetic acid-based etchant may be used. Moreover, in order to pattern the first electrode 218, an etchant that does not contain hydrofluoric acid potassium and hydrogen peroxide may be used.

For reference, Ag may be etched by phosphate or a nitrate anion (according to the following chemical reactions) so as to be precipitated.

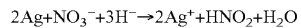
$$2Ag+NO_3^-+3H^- \rightarrow 2Ag^+ + HNO_2 + H_2O$$

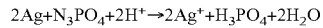
$$2Ag+N_3PO_4+2H^+ \rightarrow 2Ag^+ + H_3PO_4 + 2H_2O$$

MoTi cannot be etched by the etchant for etching Ag or Ag alloy. In case of MoTi or Ti, a component of $H_2O_2$, F is required to be included in the etchant in order to perform the desired etching process.

An oxidation process with respect to $H_2O_2$-based materials (or $H_2O_2$ group) is as follows.

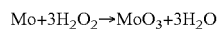
$$Mo+3H_2O_2 \rightarrow MoO_3 + 3H_2O$$

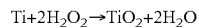
$$Ti+2H_2O_2 \rightarrow TiO_2 + 2H_2O$$

And, $MoO_3$ and $TiO_2$ are dissolved and etched by $F^-$ ions as follows.

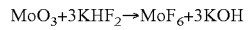
$$MoO_3+3KHF_2 \rightarrow MoF_6 + 3KOH$$

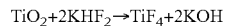
$$TiO_2+2KHF_2 \rightarrow TiF_4 + 2KOH$$

Alternatively, instead of forming an open hole (H) in the passivation layer 215c of the pad area, the open hole (H) may be formed in the passivation layer 215c using a photoresist pattern to form the bank. It may help prevent damage to the pad electrodes 226p and 227p by the patterning of the first electrode 218.

The auxiliary electrode 225 may include a first auxiliary electrode layer 225a, a second auxiliary electrode layer 225b and a third auxiliary electrode layer 225c which are made of the fifth to seventh conductive layers, respectively.

The first electrode 218 as an anode may be electrically connected to the drain electrode 223 of the driving TFT through the fourth contact hole.

Also, the first electrode 218 is formed on the substrate 210 to correspond to each of red, green and blue sub pixels.

Figure 6H:
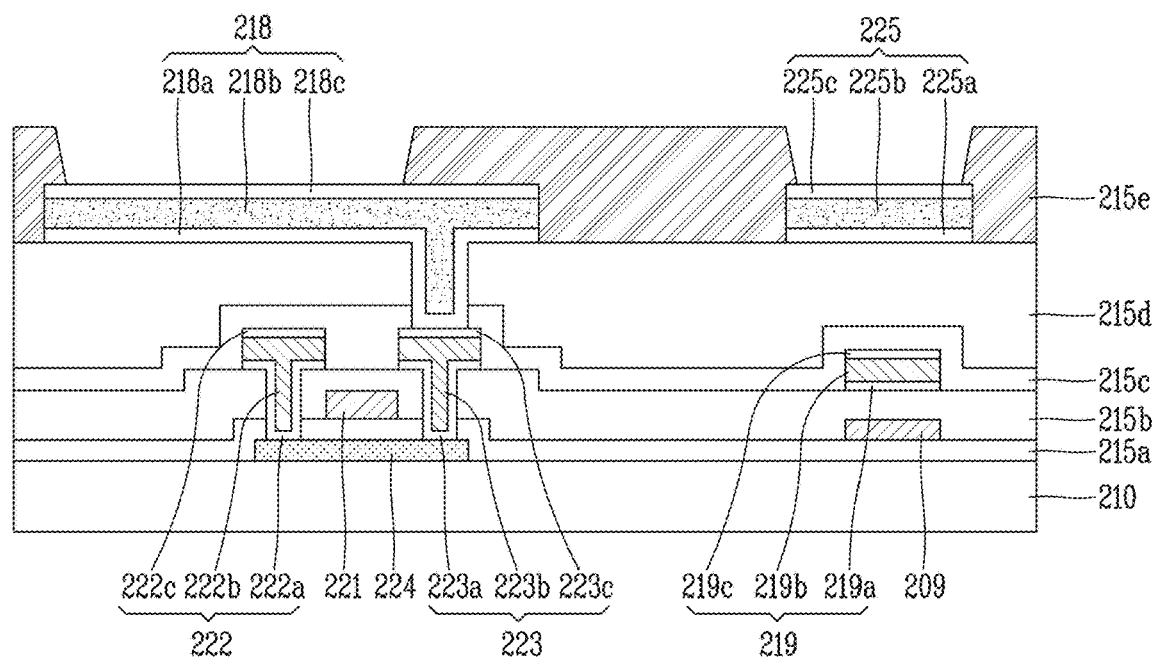

Next, as illustrated in FIG. 6H, a predetermined bank 215e is formed on the substrate 210 of the display area having the first electrode 218 and the auxiliary electrode 225.

Here, the bank 215e defines an opening by surrounding an edge region of the first electrode 218 like a bank and is made of an organic or inorganic insulating material. The bank 215e may also be made of a photosensitive material containing black pigments, and in this instance, the bank 215e may serve as a shielding member.

Also, the bank 215e further includes a second opening through which the auxiliary electrode 225 is partially exposed.

Here, as described above, after the open hole (H) exposing the pad electrodes 226p and 227p is formed by using the photoresist pattern as a mask, the bank 215e for exposing a part of the first electrode 218 may be formed. In this case, the bank 215e may be formed by re-patterning the photoresist pattern using an additional mask process.

Alternatively, the bank 215e may be formed by partially removing the photoresist pattern without any additional mask process.

Figure 6I:
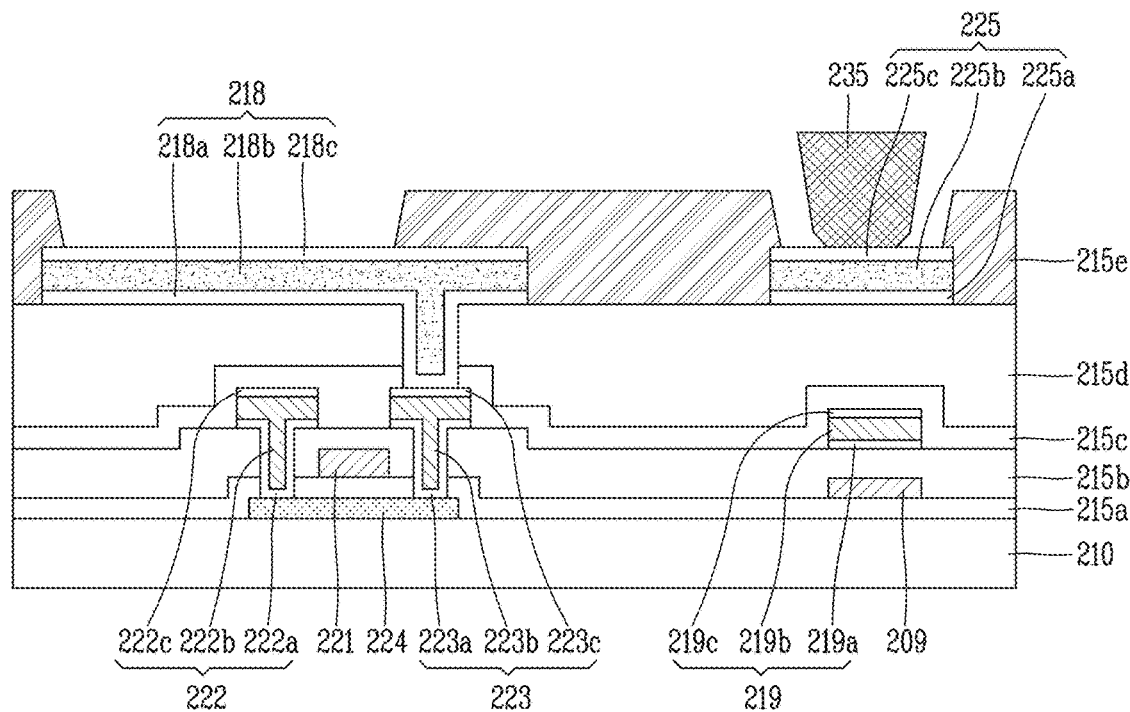

As illustrated in FIG. 6I, a barrier wall 235 is formed on the substrate 210 having the bank 215e.

The barrier wall 235 is located on the auxiliary electrode 225.

Here, the barrier wall 235 may have a reverse tapering shape that its section is reduced from top to bottom thereof. For example, an angle formed by a side surface of the barrier wall 235 and the auxiliary electrode 225 may be in the range of 20 to 80°. This reverse tapering shape having the angle at the side surface may derive a shading effect to be explained later.

Figure 6J:
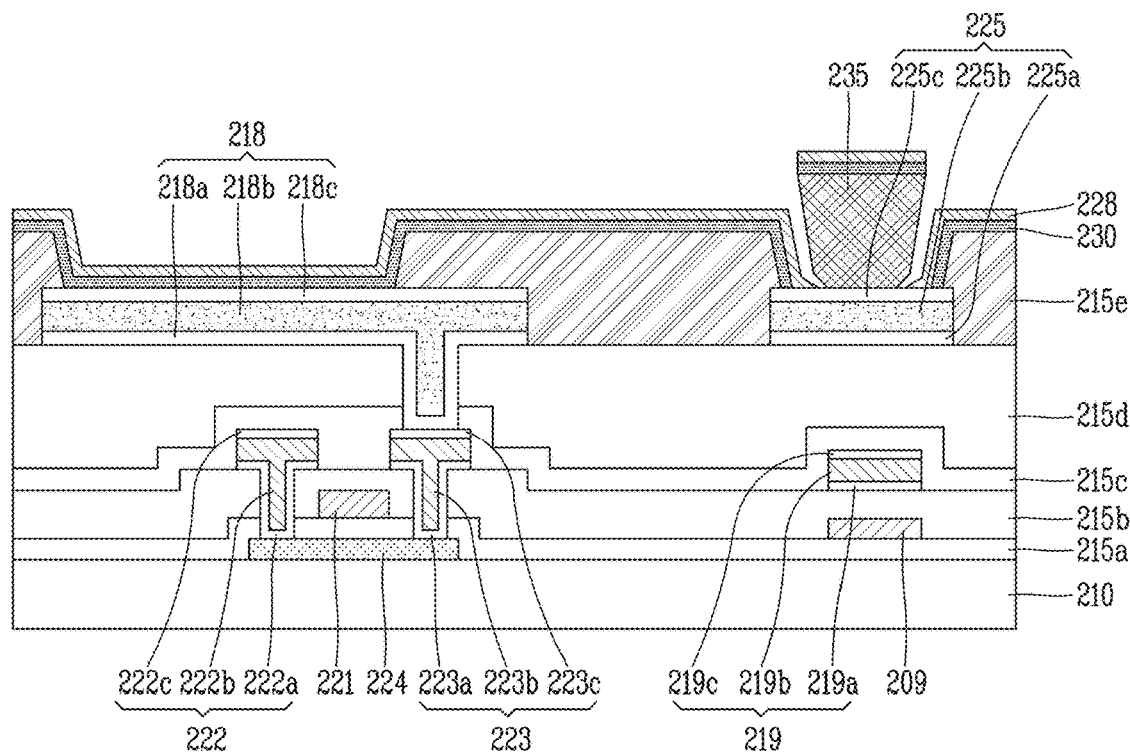

Next, as illustrated in FIG. 6J, an organic compound layer 230 is formed on the substrate 210 having the barrier wall 235 by way of evaporation.

In this instance, the barrier wall 235 forms an electrode contact hole, through which the auxiliary electrode 225 is exposed, on the organic compound layer 230. The organic compound layer 230 is formed on the top the barrier wall 235, and not formed below the top of the barrier wall 235 by the shading effect. Accordingly, the electrode contact hole is formed through the organic contact hole 230.

To this end, although not illustrated, a hole injection layer and a hole transport layer are sequentially formed on the substrate 210.

Here, the hole injection layer and the hole transport layer are commonly formed on each of the red, green and blue sub pixels, so as to allow for smooth injection and transport of the holes. Here, one of the hole injection layer and the hole transport layer may be omitted.

Next, a light-emitting layer is formed on the substrate 210 having the hole transport layer.

Here, the light-emitting layer may include a red light-emitting layer, a green light-emitting layer and a blue-light emitting layer to correspond to the red, green and blue sub pixels.

An electron transport layer is then formed on the substrate 210 having the light-emitting layer.

Here, the electron transport layer is commonly formed on each of the red, green and blue sub pixels on the light-emitting layer, so as to allow for smooth transport of the electrons.

Here, an electron injection layer for smooth injection of the electrons may further be formed on the electron transport layer.

A second electrode 228 made of an eighth conductive layer is formed on the substrate 210 having the electron transport layer in a sputtering manner.

Here, the eighth conductive layer is deposited even to a lower portion of the barrier wall 235 such that the second electrode 228 can come in contact with the auxiliary electrode 225.

The thusly-fabricated OLED is encapsulated by a predetermined thin film encapsulation layer.

A polarization film for reducing reflection of external light of the OLED display device so as to improve a contrast ratio may be provided on the thin film encapsulation layer.

Figure 8A:
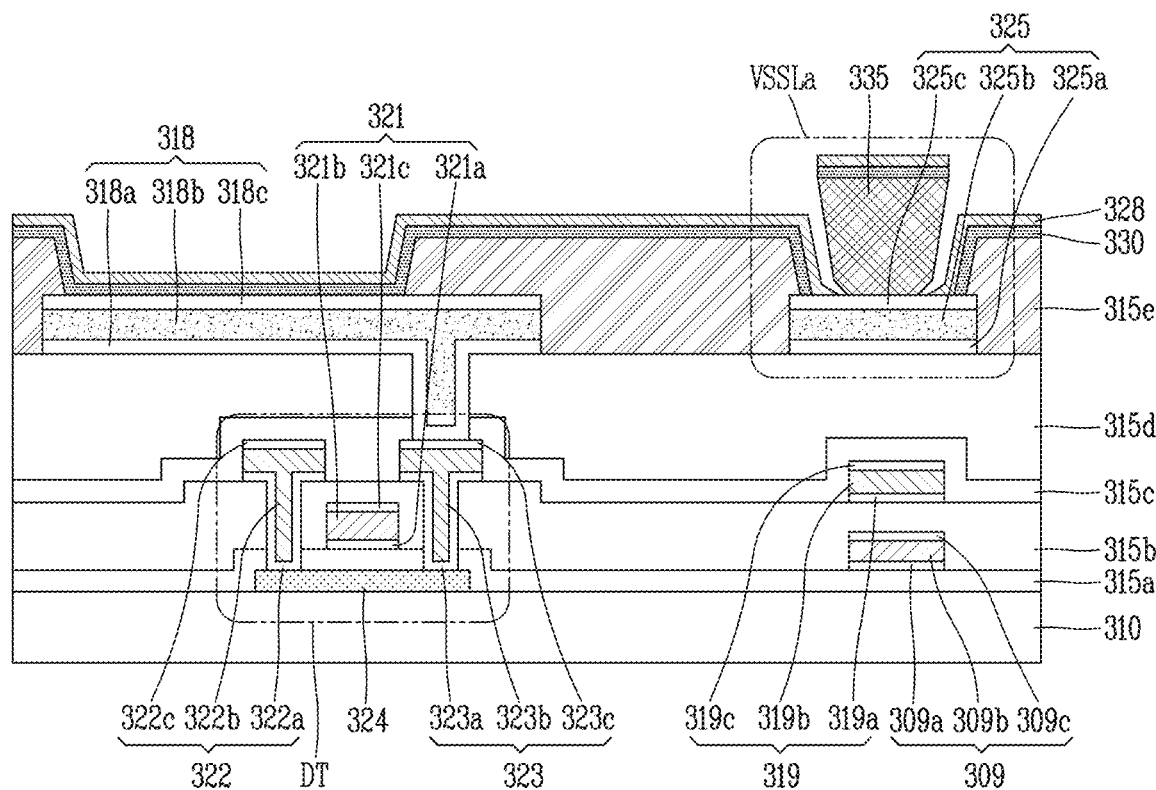
FIGS. 8A and 8B are sectional views schematically illustrating a partial structure of an OLED display device in accordance with a third embodiment of the present invention.
Figure 8B:
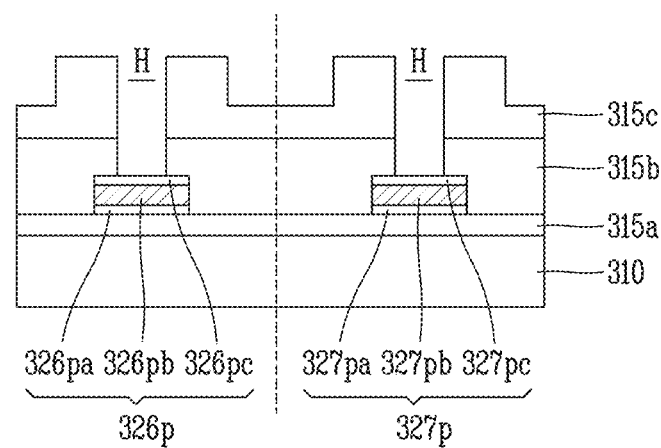

FIGS. 8A and 8B are sectional views schematically illustrating a partial structure of an OLED display device in accordance with a third embodiment of the present invention.

ere, the configuration of the OLED display device in accordance with the third embodiment of the present invention (except for a gate pad electrode and a data pad electrode formed of a gate wiring and a data wiring, respectively, in a layer of the gate wiring) is substantially the same as the configuration of the aforementioned OLED display device in accordance with the second embodiment of the present invention.

FIG. 8A illustrates one exemplary sub pixel including a TFT part and a capacitor forming part of an OLED display device, and FIG. 8B sequentially illustrates parts of a gate pad area and a data pad area.

Specifically, FIG. 8A illustrates one exemplary sub pixel of a top emission type OLED display device using a coplanar TFT, but the present invention may not be limited to the coplanar TFT.

Referring to FIG. 8A, the top emission type OLED display device according to the third embodiment of the present invention includes a substrate 310, a driving TFT DT, an OLED and an auxiliary electrode line VSSLa. But it is not limited to this. The present invention may not include the auxiliary electrode line VSSLa.

First, as the same as the first and second embodiments, the driving TFT DT includes a semiconductor layer 324, a gate electrode 321, a source electrode 322 and a drain electrode 323.

The semiconductor layer 324 is formed on a substrate 310 which is made of an insulating material, such as silicon Si, glass, transparent plastic or a polymer film. But it is not limited to this. In other words, the substrate 310 may be formed from any material capable of supporting pluralities of layers and elements.

The semiconductor layer 324 may be made of amorphous silicon or polycrystalline silicon with crystallized amorphous silicon.

Here, a buffer layer may further be located between the substrate 310 and the semiconductor layer 324. The buffer layer may be formed to protect the TFT from impurities such as alkaline ion discharged from the substrate 310 during crystallization of the semiconductor layer 324.

A gate insulating layer 315a which is made of silicon nitride (SiNx) or silicon dioxide ($SiO_2$) is formed on the semiconductor layer 324, and a gate line including the gate electrode 321 and a lower sustaining electrode 309 are formed on the gate insulating layer 315a.

The gate insulating layer 315a may be formed in the display area and the pad area. In other words, the gate insulating layer 315a may be formed on the entire surface of the substrate 310 provided with the semiconductor layer 324. But it is not limited to this.

The gate electrode 321 may be formed in such a manner as to overlap with the semiconductor layer 324 within the display area.

The gate electrode 321 and the gate line may be formed in a single body united with each other.

The gate electrode 321, the gate line and the lower sustaining electrode 309 may be formed in a multi-layered structure including at least two layers.

For example, the gate electrode 321 may have a three-layered structure of a first gate electrode 321a, a second gate electrode 321b and a third gate electrode 321c. The lower sustaining electrode 309 may also have a three-layered structure of a first lower sustaining electrode 309a, a second lower sustaining electrode 309b and a third lower sustaining electrode 309c.

The first gate electrode 321a and the first lower sustaining electrode 309a may be formed from the same material. Also, the first gate electrode 321a and the first lower sustaining electrode 309a may increase adhesive strengths of the second gate electrode 321b and the second lower sustaining electrode 309b, respectively.

For example, the first gate electrode 321a and the first lower sustaining electrode 309a may be formed from one of molybdenum titanium MoTi, titanium Ti or an alloy thereof.

The second gate electrode 321b and the second lower sustaining electrode 309b may be formed from the same material. Also, the second gate electrode 321b and the second lower sustaining electrode 309b may be formed from a low resistive material. For example, the second gate electrode 321b and the second lower sustaining electrode 309b may be formed from one selected from a material group which includes aluminum Al, tungsten W, copper Cu, silver Ag, molybdenum Mo, chromium Cr, tantalum Ta, titanium Ti, or alloys thereof. Preferably, the second gate electrode 321b and the second lower sustaining electrode 309b may be formed from copper Cu.

The third gate electrode 321c and the third lower sustaining electrode 309c may be formed from the same material. Also, the third gate electrode 321c and the third lower sustaining electrode 309c may be formed from a material which is not corroded by moisture and oxygen in spite of being exposed to the exterior. For example, the third gate electrode 321c and the third lower sustaining electrode 309c may be formed from one of molybdenum titanium MoTi, titanium Ti or an alloy thereof.

For example, the gate wiring according to the third embodiment of the present invention may have a three-layered structure of MoTi/Cu/MoTi.

An inter-layer insulating layer 315b which is made of silicon nitride or silicon dioxide is provided on the gate electrode 321, the gate line and the lower sustaining electrode 309. On the inter-layer insulating layer 315b are provided a data line, a driving voltage line, source and drain electrodes 322 and 323 and a upper sustaining electrode 319.

Also, a plurality of contact holes may be formed in the inter-layer insulating layer 315b.

The source electrode 322 and the drain electrode 323 are spaced apart from each other by a predetermined interval, and electrically connected to the semiconductor layer 324. In more detail, a semiconductor layer contact hole through which the semiconductor layer 324 is exposed is formed through the gate insulating layer 315a and the inter-layer insulating layer 315b, such that the source and drain electrodes 322 and 323 are electrically connected to the semiconductor layer 324.

The source electrode 322 and the data line may be formed in a single body united with each other.

Here, the upper sustaining electrode 319 overlaps a part of the lower sustaining electrode 309 with the inter-layer insulating layer 315b interposed therebetween, thereby forming a storage capacitor.

Here, the data line, the driving voltage line, the source and drain electrodes 322 and 323 and the upper sustaining electrode 319 according to the third embodiment of the present invention may have a multi-layered structure with three layers or more.

That is, the source electrode 322 may have a three-layered structure of a first source electrode layer 322a, a second source electrode layer 322b and a third source electrode layer 322c, and the drain electrode 323 may have a three-layered structure of a first drain electrode layer 323a, a second drain electrode layer 323b and a third drain electrode layer 323c.

The upper sustaining electrode 319 may also have a three-layered structure of a first upper sustaining electrode layer 319a, a second upper sustaining electrode layer 319b and a third upper sustaining electrode layer 319c.

The first source electrode layer 322a, the first drain electrode layer 323a and the first upper sustaining electrode layer 319a may be formed from the same material. Also, the first source electrode layer 322a, the first drain electrode layer 323a and the first upper sustaining electrode layer 319a may increase adhesive strengths of the second source electrode layer 322b, the second drain electrode layer 323b and the second upper sustaining electrode layer 319b.

For example, the first source electrode layer 322a, the first drain electrode layer 323a and the first upper sustaining electrode layer 319a may be formed from one of molybdenum titanium MoTi, titanium Ti or an alloy thereof.

The second source electrode layer 322b, the second drain electrode layer 323b and the second upper sustaining electrode layer 319b may be formed from the same material. Also, the second source electrode layer 322b, the second drain electrode layer 323b and the second upper sustaining electrode layer 319b may be formed from a low resistive material. For example, the second source electrode layer 322b, the second drain electrode layer 323b and the second upper sustaining electrode layer 319b may be formed from one selected from a material group which includes aluminum Al, tungsten W, copper Cu, silver Ag, molybdenum Mo, chromium Cr, tantalum Ta, titanium Ti, or alloys thereof. Preferably, the second source electrode layer 322b, the second drain electrode layer 323b and the second upper sustaining electrode layer 319b may be formed from copper Cu.

The third source electrode layer 322c, the third drain electrode layer 323c and the third upper sustaining electrode layer 319c may be formed from the same material. Also, the third source electrode layer 322c, the third drain electrode layer 323c and the third upper sustaining electrode layer 319c may be formed from a material which is not corroded by moisture and oxygen in spite of being exposed to the exterior. For example, the third source electrode layer 322c, the third drain electrode layer 323c and the third upper sustaining electrode layer 319c may be formed from one of molybdenum titanium MoTi, titanium Ti or an alloy thereof.

For example, the data wiring according to the third embodiment of the present invention may have a three-layered structure of MoTi/Cu/MoTi.

A passivation layer 315c and a planarization layer 315d are provided on the substrate 310 having data line, the driving voltage line, the source and drain electrodes 322 and 323 and the upper sustaining electrode 319. The passivation layer 315c may be formed on the entire surface of the substrate 310 including both of the display area and the pad area. The planarization layer 315d may be formed on the display area in which the TFT is formed.

Next, the OLED may include a first electrode 318, an organic compound layer 330 and a second electrode 328.

The OLED is electrically connected to the driving TFT DT. In more detail, a drain contact hole through which the drain electrode 323 of the driving TFT DT is exposed is formed through the passivation layer 315c and the planarization layer 315d which are located on the driving TFT DT.

That is, the first electrode 318 is provided on the planarization layer 315d, and electrically connected to the drain electrode 323 of the driving TFT DT through the drain contact hole.

The first electrode 318 is to supply a current (or a voltage) to the organic compound layer 330, and defines a light-emitting region with a predetermined area (or size).

The first electrode 318 serves as an anode. Accordingly, the first electrode 318 may include a transparent conductive material with a relatively great work function. Also, the first electrode 318 may be formed in a multi-layered structure including a plurality of electrode layers. For example, the first electrode 318 may be formed in a three-layered structure which is prepared by sequentially stacking a first electrode layer 318a, a second electrode layer 318b and third electrode layer 318c.

The first electrode layer 318a may increase the adhesive strength of the second electrode layer 318b. The first electrode layer 318a may be formed of Indium Tin Oxide (ITO) or Indium Zinc Oxide (IZO). To improve reflectivity, the second electrode layer 318b may be a reflection layer made of a metal with high reflectivity. Examples of the metal having the high reflectivity may include aluminum (Al), silver (Ag), gold (Au), platinum (Pt), chrome (Cr) or alloy thereof.

The third electrode layer 318c may have a high work function. As such, the first electrode 318 may be used as the anode electrode. Such a third electrode layer 318c may be a transparent conductive layer. For example, the third electrode layer 318c may be formed from ITO or IZO. However, the present invention may not be limited to this.

A bank 315e is formed on the substrate 310 having the first electrode 318. Here, the bank 315e defines a first opening by surrounding an edge of the first electrode 318 like a bank. The bank 315e may be made of an organic or inorganic insulating material. The bank 315e may also be made of a photosensitive material containing black pigments. In this instance, the bank 315e serves as a shielding member.

The bank 315e may be formed to surround edges of the first electrode 318. As such, any corrosion of the edges of the first electrode 318 may be prevented.

Here, in the third embodiment of the present invention, the bank 315e further include a second opening through which an auxiliary electrode 325 to be explained later is partially exposed.

The organic compound layer 330 is provided between the first electrode 318 and the second electrode 328.

Here, FIG. 8A illustrates an example that the organic compound layer 330 is formed on an entire surface of the substrate 310. However, the present invention may not be limited to this. The organic compound layer 330 may also be formed on the first electrode 318.

Although it is shown in FIG. 8A that the organic compound layer 330 is formed in a single layer, the organic compound layer 330 is not limited to this. The organic compound layer 330 may have a multi-layered structure including a light-emitting layer to emit light and an auxiliary layer for improving light-emission efficiency of the light-emitting layer.

The second electrode 328 is formed on the organic compound layer 330 to supply electrons to the organic compound layer 330.

The second electrode 328 serves as a cathode. Accordingly, the second electrode 328 may be made of a transparent conductive material. An example of the transparent conductive material may include ITO or IZO. The second electrode 328 may further include a metal layer which is provided at a side contactable with the organic compound layer 330 and is formed of a metal with a low work function. Examples of the metal with the low work function may include magnesium (Mg), silver (Ag) and a compound thereof.

As the same as the first and second embodiments of the present invention, an auxiliary electrode line VSSLa and the first electrode 318 are provided on the same layer to reduce resistance of the second electrode 328. Here, the auxiliary electrode line VSSLa includes the auxiliary electrode 325 and the barrier wall 335.

The auxiliary electrode 325 and the first electrode 318 are formed on the same layer. The auxiliary electrode 325 is spaced apart from the first electrode 318. For example, the auxiliary electrode 325 may extend long in one direction to be connected to an external VSS pad.

The auxiliary electrode 325 may be implemented into a three-layered structure of a first auxiliary electrode layer 325a, a second auxiliary electrode layer 325b and a third auxiliary electrode layer 325c, as substantially the same as the structure of the first electrode 318. In this instance, upon depositing the second electrode 328, the second electrode 328 may come in contact directly with the third auxiliary electrode layer 325c of the auxiliary electrode 325. That is, the second electrode 328 is deposited even to a lower portion of the barrier wall 335 so as to come in contact with the auxiliary electrode 325. However, the present invention may not be limited to this.

The barrier wall 335 is located on the auxiliary electrode 325.

Here, the barrier wall 335 may have a tapering shape that its cross-section is reduced from top to bottom thereof. For example, an angle formed by a side surface of the barrier wall 335 and the auxiliary electrode 325 may be in the range of 20 to 80°. This reverse tapering shape having the angle at the side surface may derive a shading effect to be explained later.

The barrier wall 335 forms an electrode contact hole through the organic compound layer 330 so as to expose the auxiliary electrode 325 therethrough. The organic compound layer 330 is formed on a top of the barrier wall 335, but not formed below the barrier wall 335 by the shading effect. Accordingly, the electrode contact hole is formed through the organic compound layer 330.

The organic compound layer 330 and the second electrode 328 are sequentially stacked (laminated) on the barrier wall 335.

The pad area is an edge area of the TFT substrate 310 having the display area. The pad area includes a gate pad area and a data pad area.

Referring to FIG. 8B, a gate pad electrode 326p and a data pad electrode 327p which are electrically connected to a gate line and a data line, respectively, are located on the gate pad area and the data pad area. The gate pad electrode 326p and the data pad electrode 327p transfer a scan signal and a data signal applied from an external driving circuit to the gate line and the data line, respectively.

That is, the gate line and the data line extend toward the driving circuit to be connected to corresponding gate pad line 316p and data pad line 317p, respectively. The gate pad line 316p and the data pad line 317p are electrically connected to the gate pad electrode 326p and the data pad electrode 327p, respectively. Therefore, the gate line and the data line receive the scan signal and the data signal, respectively, from the driving circuit through the gate pad electrode 326p and the data pad electrode 327p.

The gate pad electrode 326p and the gate line may be formed in a single body united with each other.

Moreover, the gate pad electrode 326p may be formed through the same process as the gate line and the gate electrode 321.

The data pad electrode 327p and the data line may be formed in a single body united with each other.

Also, the data pad electrode 327p may be formed through the same process as the data line and the source and drain electrodes 322 and 323.

An open hole H exposing the gate pad electrode 326p and the data pad electrode 327p may be formed in the inter-layer insulating layer 315b and the passivation layer 315c of the pad area.

Then, the gate pad electrode 326p and the data pad electrode 327p according to the third embodiment of the present invention are formed on the same layer as the gate wiring of the display area, here have substantially the same three-layered structure as the gate wiring and the data wiring, respectively, for example the three-layered structure of MoTi/Cu/MoTi.

That is, in the third embodiment of the present invention, the three-layered structure of MoTi/Cu/MoTi having etch selectivity with respect to an etchant for etching Ag or Ag alloy is applied to the gate pad electrode 326p and the data pad electrode 327p of the pad area, and also parts of the gate pad electrode 326p and the data pad electrode 327p are externally exposed by forming an open hole H during patterning of the passivation layer 315c.

In this instance, the upper MoTi may serve as an etch stopper of the etchant for etching Ag or Ag alloy.

As described above, in order to pattern the first electrode 318, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+acetic acid-based etchant may be used. Also, in order to pattern the first electrode 318, an etchant that does not contain hydrofluoric acid potassium and hydrogen peroxide may be used.

Here, the gate pad electrode 326p according to the third embodiment of the present invention may have the three-layered structure of a first gate pad electrode layer 326pa, a second gate pad electrode layer 326pb and a third gate pad electrode layer 326pc, and the data pad electrode 327p may have the three-layered structure of a first data pad electrode layer 327pa, a second data pad electrode layer 327pb and a third data pad electrode layer 327pc.

The lowermost layers, i.e. the first gate pad electrode layer 326pa and the first data pad electrode layer 327pa may be an adhesion promoting layer increasing the adhesive strength of the second gate pad electrode layer 326pb and the second data pad electrode layer 327pb.

The second gate pad electrode layer 326pb and the second data pad electrode layer 327pb may be formed from a low resistive material compared with the first gate pad electrode layer 326pa, the first data pad electrode layer 327pa and the third gate pad electrode layer 326pc, the third data pad electrode layer 327pc.

As described above, the uppermost third pad electrode layers 326pc and 327pc may be formed from a material which is not corroded by oxygen and moisture, even though they are externally exposed. In other words, the third pad electrode layers 326pc and 327pc may be formed from a material being not etched by an etchant which may be used to form the first electrode 318. For example, the third pad electrode layers 326pc and 327pc may be formed from one of molybdenum titanium MoTi, titanium Ti or an alloy thereof.

Also, the passivation layer 315c may be formed in such a manner as to expose upper surfaces of the third pad electrode layers 326pc and 327pc of the pad electrodes 326p and 327p. In this case, the passivation layer 315c may be formed in such a manner as to cover entire surfaces of the pad electrodes 326p and 327p except for the exposed third pad electrode layers 326pc and 327pc. As such, any corrosion of the sides of the third pad electrode layers 326pc and 327pc may be prevented. For example, the passivation layer 315c may be formed in such a manner as to cover sides of the first pad electrode layers 326pa and 327pa, the second pad electrode layers 326pb and 327pb and the third pad electrode layers 326pc and 327pc, and at least some portions of the upper surfaces of the third pad electrode layers 326pc and 327pc.

Figure 9A:
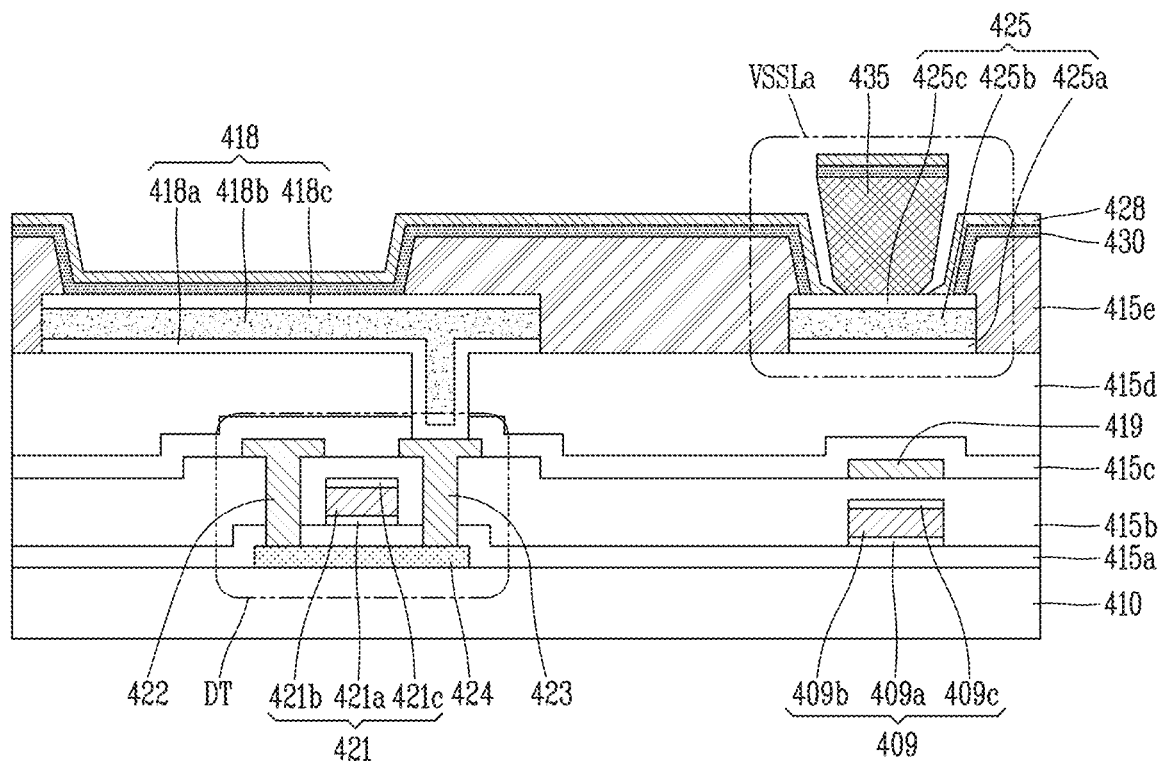
FIGS. 9A and 9B are sectional views schematically illustrating a partial structure of an OLED display device in accordance with a fourth embodiment of the present invention.
Figure 9B:
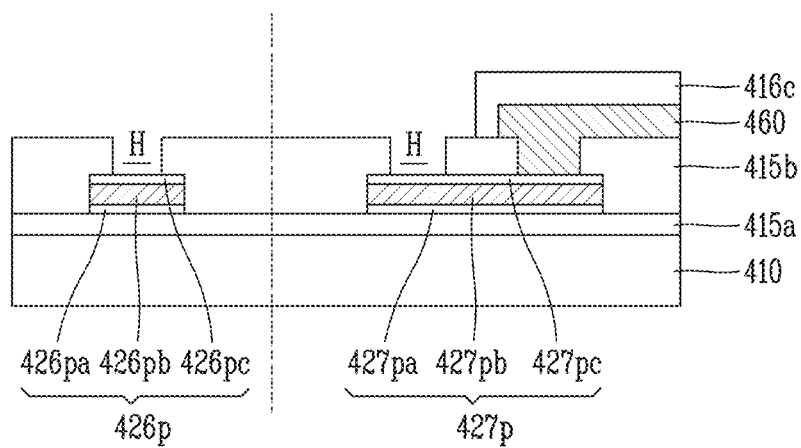

FIGS. 9A and 9B are sectional views schematically illustrating a partial structure of an OLED display device in accordance with a fourth embodiment of the present invention.

Here, the configuration of the OLED display device in accordance with the fourth embodiment of the present invention (except for a gate pad electrode and a data pad electrode formed of a gate wiring in a layer of the gate wiring) is substantially the same as the configuration of the aforementioned OLED display device in accordance with the second and third embodiments of the present invention.

FIG. 9A illustrates one exemplary sub pixel including a TFT part and a capacitor forming part of an OLED display device, and FIG. 9B sequentially illustrates parts of a gate pad area and a data pad area.

Specifically, FIG. 9A illustrates one exemplary sub pixel of a top emission type OLED display device using a coplanar TFT, but the present invention may not be limited to the coplanar TFT.

Referring to FIG. 9A, the top emission type OLED display device according to the fourth embodiment of the present invention includes a substrate 410, a driving TFT DT, an OLED and an auxiliary electrode line VSSLa. But it is not limited to this. The present invention may not include the auxiliary electrode line VSSLa.

First, as the same as the first, second and third embodiments, the driving TFT DT includes a semiconductor layer 424, a gate electrode 421, a source electrode 422 and a drain electrode 423.

The semiconductor layer 424 is formed on a substrate 410 which is made of an insulating material, such as silicon Si, glass, transparent plastic or a polymer film. But it is not limited to this. In other words, the substrate 410 may be formed from any material capable of supporting pluralities of layers and elements.

The semiconductor layer 424 may be made of amorphous silicon or polycrystalline silicon with crystallized amorphous silicon.

Here, a buffer layer may further be located between the substrate 410 and the semiconductor layer 424. The buffer layer may be formed to protect the TFT from impurities such as alkaline ion discharged from the substrate 410 during crystallization of the semiconductor layer 424.

A gate insulating layer 415a which is made of silicon nitride (SiNx) or silicon dioxide (SiO$_2$) is formed on the semiconductor layer 424, and a gate line including the gate electrode 421 and a lower sustaining electrode 409 are formed on the gate insulating layer 415a.

The gate insulating layer 415a may be formed in the display area and the pad area. In other words, the gate insulating layer 415a may be formed on the entire surface of the substrate 410 provided with the semiconductor layer 424. But it is not limited to this.

The gate electrode 421 may be formed in such a manner as to overlap with the semiconductor layer 424 within the display area.

The gate electrode 421 and the gate line may be formed in a single body united with each other.

The gate electrode 421, the gate line and the lower sustaining electrode 409 may be formed in a multi-layered structure including at least two layers.

For example, the gate electrode 421 may have a three-layered structure of a first gate electrode 421a, a second gate electrode 421b and a third gate electrode 421c. The lower sustaining electrode 409 may also have a three-layered structure of a first lower sustaining electrode 409a, a second lower sustaining electrode 409b and a third lower sustaining electrode 409c.

The first gate electrode 421a and the first lower sustaining electrode 409a may be formed from the same material. Also, the first gate electrode 421a and the first lower sustaining electrode 409a may increase adhesive strengths of the second gate electrode 421b and the second lower sustaining electrode 409b, respectively.

For example, the first gate electrode 421a and the first lower sustaining electrode 409a may be formed from one of molybdenum titanium MoTi, titanium Ti or an alloy thereof.

The second gate electrode 421b and the second lower sustaining electrode 409b may be formed from the same material. Also, the second gate electrode 421b and the second lower sustaining electrode 409b may be formed from a low resistive material. For example, the second gate electrode 421b and the second lower sustaining electrode 409b may be formed from one selected from a material group which includes aluminum Al, tungsten W, copper Cu, silver Ag, molybdenum Mo, chromium Cr, tantalum Ta, titanium Ti, or alloys thereof. Preferably, the second gate electrode 421b and the second lower sustaining electrode 409b may be formed from copper Cu.

The third gate electrode 421c and the third lower sustaining electrode 409c may be formed from the same material. Also, the third gate electrode 421c and the third lower sustaining electrode 409c may be formed from a material which is not corroded by moisture and oxygen in spite of being exposed to the exterior. For example, the third gate electrode 421c and the third lower sustaining electrode 409c may be formed from one of molybdenum titanium MoTi, titanium Ti or an alloy thereof.

For example, the gate wiring according to the fourth embodiment of the present invention may have a three-layered structure of MoTi/Cu/MoTi.

An inter-layer insulating layer 415b which is made of silicon nitride or silicon dioxide is provided on the gate electrode 421, the gate line and the lower sustaining electrode 409. On the inter-layer insulating layer 415b are provided a data line, a driving voltage line, source and drain electrodes 422 and 423 and a upper sustaining electrode 419.

Also, a plurality of contact holes may be formed in the inter-layer insulating layer 415b.

The source electrode 422 and the drain electrode 423 are spaced apart from each other by a predetermined interval, and electrically connected to the semiconductor layer 424. In more detail, a semiconductor layer contact hole through which the semiconductor layer 424 is exposed is formed through the gate insulating layer 415a and the inter-layer insulating layer 415b, such that the source and drain electrodes 422 and 423 are electrically connected to the semiconductor layer 424.

The source electrode 422 and the data line may be formed in a single body united with each other.

Here, the upper sustaining electrode 419 overlaps a part of the lower sustaining electrode 409 with the inter-layer insulating layer 415b interposed therebetween, thereby forming a storage capacitor.

The data line, the driving voltage line, the source and drain electrodes 422 and 423 and the upper sustaining electrode 419 according to the fourth embodiment of the present invention may be formed into a single layer or a multilayer made of a second metallic material having a low resistance characteristic, such as aluminum (Al), copper (Cu), molybdenum (Mo), chrome (Cr), gold (Au), titanium (Ti), nickel (Ni), neodymium (Nd), or alloy thereof.

A passivation layer 415c and a planarization layer 415d are provided on the substrate 410 having data line, the driving voltage line, the source and drain electrodes 422 and 423 and the upper sustaining electrode 419. The passivation layer 415c may be formed on the display area and the data pad area. The planarization layer 415d may be formed on the display area in which the TFT is formed.

Next, the OLED may include a first electrode 418, an organic compound layer 430 and a second electrode 428.

The OLED is electrically connected to the driving TFT DT. In more detail, a drain contact hole through which the drain electrode 423 of the driving TFT DT is exposed is formed through the passivation layer 415c and the planarization layer 415d which are located on the driving TFT DT.

That is, the first electrode 418 is provided on the planarization layer 415d, and electrically connected to the drain electrode 423 of the driving TFT DT through the drain contact hole.

The first electrode 418 is to supply a current (or a voltage) to the organic compound layer 430, and defines a light-emitting region with a predetermined area (or size).

The first electrode 418 serves as an anode. Accordingly, the first electrode 418 may include a transparent conductive material with a relatively great work function. Also, the first electrode 418 may be formed in a multi-layered structure including a plurality of electrode layers. For example, the first electrode 418 may be formed in a three-layered structure which is prepared by sequentially stacking a first electrode layer 418a, a second electrode layer 418b and third electrode layer 418c.

The first electrode layer 418a may increase the adhesive strength of the second electrode layer 418b. The first electrode layer 418a may be formed of Indium Tin Oxide (ITO) or Indium Zinc Oxide (IZO). To improve reflectivity, the second electrode layer 418b may be a reflection layer made of a metal with high reflectivity. Examples of the metal having the high reflectivity may include aluminum (Al), silver (Ag), gold (Au), platinum (Pt), chrome (Cr) or alloy thereof.

The third electrode layer 418c may have a high work function. As such, the first electrode 418 may be used as the anode electrode. Such a third electrode layer 418c may be a transparent conductive layer. For example, the third electrode layer 418c may be formed from ITO or IZO. However, the present invention may not be limited to this.

A bank 415e is formed on the substrate 410 having the first electrode 418. Here, the bank 415e defines a first opening by surrounding an edge of the first electrode 418 like a bank. The bank 415e may be made of an organic or inorganic insulating material. The bank 415e may also be made of a photosensitive material containing black pigments. In this instance, the bank 415e serves as a shielding member.

The bank 415e may be formed to surround edges of the first electrode 418. As such, any corrosion of the edges of the first electrode 418 may be prevented.

Here, in the fourth embodiment of the present invention, the bank 415e further include a second opening through which an auxiliary electrode 425 to be explained later is partially exposed.

The organic compound layer 430 is provided between the first electrode 418 and the second electrode 428.

Here, FIG. 9A illustrates an example that the organic compound layer 430 is formed on an entire surface of the substrate 410. However, the present invention may not be limited to this. The organic compound layer 430 may also be formed on the first electrode 418.

Although it is shown in FIG. 9A that the organic compound layer 430 is formed in a single layer, the organic compound layer 430 is not limited to this. The organic compound layer 430 may have a multi-layered structure including a light-emitting layer to emit light and an auxiliary layer for improving light-emission efficiency of the light-emitting layer.

The second electrode 428 is formed on the organic compound layer 430 to supply electrons to the organic compound layer 430.

The second electrode 428 serves as a cathode. Accordingly, the second electrode 428 may be made of a transparent conductive material. An example of the transparent conductive material may include ITO or IZO. The second electrode 428 may include a metal layer which is contactable with the organic compound layer 430 and is formed of a metal with a low work function. Examples of the metal with the low work function may include magnesium (Mg), silver (Ag) or a compound thereof.

As the same as the first, second and third embodiments of the present invention, an auxiliary electrode line VSSLa and the first electrode 418 are provided on the same layer to reduce resistance of the second electrode 428. Here, the auxiliary electrode line VSSLa includes the auxiliary electrode 425 and the barrier wall 435.

The auxiliary electrode 425 and the first electrode 418 are formed on the same layer. The auxiliary electrode 425 is spaced apart from the first electrode 418. For example, the auxiliary electrode 425 may extend long in one direction to be connected to an external VSS pad.

The auxiliary electrode 425 may be implemented into a three-layered structure of a first auxiliary electrode layer 425a, a second auxiliary electrode layer 425b and a third auxiliary electrode layer 425c, as substantially the same as the structure of the first electrode 418. In this instance, upon depositing the second electrode 428, the second electrode 428 may come in contact directly with the third auxiliary electrode layer 425c of the auxiliary electrode 425. That is, the second electrode 428 is deposited even to a lower portion of the barrier wall 435 so as to come in contact with the auxiliary electrode 425. However, the present invention may not be limited to this.

The barrier wall 435 is located on the auxiliary electrode 425.

Here, the barrier wall 435 may have a tapering shape that its cross-section is reduced from top to bottom thereof. For example, an angle formed by a side surface of the barrier wall 435 and the auxiliary electrode 425 may be in the range of 20 to 80°. This reverse tapering shape having the angle at the side surface may derive a shading effect to be explained later.

The barrier wall 435 forms an electrode contact hole through the organic compound layer 430 so as to expose the auxiliary electrode 425 therethrough. The organic compound layer 430 is formed on a top of the barrier wall 435, but not formed below the barrier wall 435 by the shading effect. Accordingly, the electrode contact hole is formed through the organic compound layer 430.

The organic compound layer 430 and the second electrode 428 are sequentially stacked (laminated) on the barrier wall 435.

The pad area is an edge area of the TFT substrate 410 having the display area. The pad area includes a gate pad area and a data pad area.

Referring to FIG. 9B, a gate pad electrode 426p and a data pad electrode 427p which are electrically connected to a gate line and a data line, respectively, are located on the gate pad area and the data pad area. The gate pad electrode 426p and the data pad electrode 427p transfer a scan signal and a data signal applied from an external driving circuit to the gate line and the data line, respectively.

That is, the gate line and the data line extend toward the driving circuit to be connected to corresponding gate pad electrode 426p and the data pad electrode 427p, respectively. Therefore, the gate line and the data line receive the scan signal and the data signal, respectively, from the driving circuit through the gate pad electrode 426p and the data pad electrode 427p.

The gate pad electrode 426p and the gate line may be formed in a single body united with each other.

On the other hand, the data pad electrode 427p may be electrically connected with the data line via a connection wiring 460 formed in a layer of the gate wiring.

Moreover, the gate pad electrode 426p and the data pad electrode 427p may be formed through the same process as the gate line and the gate electrode 421. Also, the connection wiring 460 of the pad area may be formed through the same process as the data line and the source and drain electrodes 422 and 423.

An open hole H exposing the gate pad electrode 426p and the data pad electrode 427p may be formed in the inter-layer insulating layer 415b and the passivation layer 415c of the pad area. Thus, a portion of an upper surface of the data pad electrode 427p may be exposed to the outside through the open hole H, and the other portion of the upper surface of the data pad electrode 427p may be connected to the connection wiring 460 through a contact hole. The connection wiring 460 may be a data line which may be extended.

Also, the inter-layer insulating layer 415b of the pad area may be formed in such a manner as to surround (and sealing) the sides of the pad electrodes 426p and 427p. As such, any corrosion of the sides of the pad electrodes 426p and 427p may be prevented.

The gate pad electrode 426p and the data pad electrode 427p according to the fourth embodiment of the present invention may be formed on the same layer as the gate wiring of the display area, then have substantially the same three-layered structure as the gate wiring, for example, the three-layered structure of MoTi/Cu/MoTi.

That is, in the third embodiment of the present invention, the three-layered structure of MoTi/Cu/MoTi having etch selectivity with respect to an etchant for etching Ag or Ag alloy is applied to the gate pad electrode 426p and the data pad electrode 427p of the pad area, and also parts of the gate pad electrode 426p and the data pad electrode 427p may be externally exposed by forming the open hole H during patterning of the passivation layer 415c.

In this instance, the upper MoTi may serve as an etch stopper of the etchant for etching Ag or Ag alloy.

As described above, in order to pattern the first electrode 418, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+acetic acid-based etchant may be used. Also, in order to pattern the first electrode 418, an etchant that does not contain hydrofluoric acid potassium and hydrogen peroxide may be used.

Here, the gate pad electrode 426p according to the fourth embodiment of the present invention may have the three-layered structure of a first gate pad electrode layer 426pa, a second gate pad electrode layer 426pb and a third gate pad electrode layer 426pc, and the data pad electrode 427p may have the three-layered structure of a first data pad electrode layer 427*pa*, a second data pad electrode layer 427*pb* and a third data pad electrode layer 427*pc*.

The lowermost layers, i.e. the first gate pad electrode layer 426*pa* and the first data pad electrode layer 427*pa* may be an adhesion promoting layer increasing the adhesive strength of the second gate pad electrode layer 426*pb* and the second data pad electrode layer 427*pb*.

The second gate pad electrode layer 426*pb* and the second data pad electrode layer 427*pb* may be formed from a low resistive material compared with the first gate pad electrode layer 426*pa*, the first data pad electrode layer 427*pa* and the third gate pad electrode layer 426*pc*, the third data pad electrode layer 427*pc*.

As described above, the uppermost third pad electrode layers 426*pc* and 427*pc* may be formed from a material which is not corroded by oxygen and moisture, even though they are externally exposed. In other words, the third pad electrode layers 426*pc* and 427*pc* may be formed from a material being not etched by an etchant which may be used to form the first electrode 418. For example, the third pad electrode layers 426*pc* and 427*pc* may be formed from one of molybdenum titanium MoTi, titanium Ti or an alloy thereof.

Also, the inter-layer insulating layer 415*b* and the passivation layer 415*c* may be formed in such a manner as to expose upper surfaces of the third pad electrode layers 426*pc* and 427*pc* of the pad electrodes 426*p* and 427*p*. In this case, the inter-layer insulating layer 415*b* may be formed in such a manner as to cover the entire surfaces of the pad electrodes 426*p* and 427*p* except for the exposed upper surface of the third gate pad electrode layer 426*pc*. As such, any corrosion of the sides of the third pad electrode layers 426*pc* and 427*pc* may be prevented. For example, the inter-layer insulating layer 415*b* may be formed in such a manner as to cover sides of the first pad electrode layers 426*pc* and 427*pa*, the second pad electrode layers 426*pb* and 427*pb* and the third pad electrode layers 426*pc* and 427*pc*, and at least some portions of the upper surfaces of the third pad electrode layers 426*pc* and 427*pc*.

Here, when the etchant for etching Ag or Ag alloy permeates into a crack generated due to impurity or a crack which is generated during patterning of the passivation layer, it may damage Cu of the gate pad electrode and the data pad electrode. To prevent the damage, the fifth embodiment of the present invention employs a clad structure in which the third gate pad electrode layer and the third data pad electrode layer cover the first and second gate pad electrode layers and the first and second data pad electrode layers.

Also, such clad structure may be applicable to the pad electrodes of the first embodiment to the fourth embodiment as well.

In the clad structure, the uppermost layer, i.e. the third gate pad electrode layer and the third data pad electrode layer are in contact with both sides of the first and second gate pad electrode layers and the first and second data pad electrode layers, respectively, as well as to be in contact with upper surfaces of the second gate pad electrode layer and the second data pad electrode layer, respectively. Thus, the third gate pad electrode layer and the third data pad electrode layer are to seal the first and second gate pad electrode layers and the first and second data pad electrode layers.

Such structure provides several effects of improvement of reliability, reduction of defects and improvement of productivity.

Hereinafter, the fifth embodiment of the present invention will be described in detail with reference to the accompanying drawing.

Figure 10A:
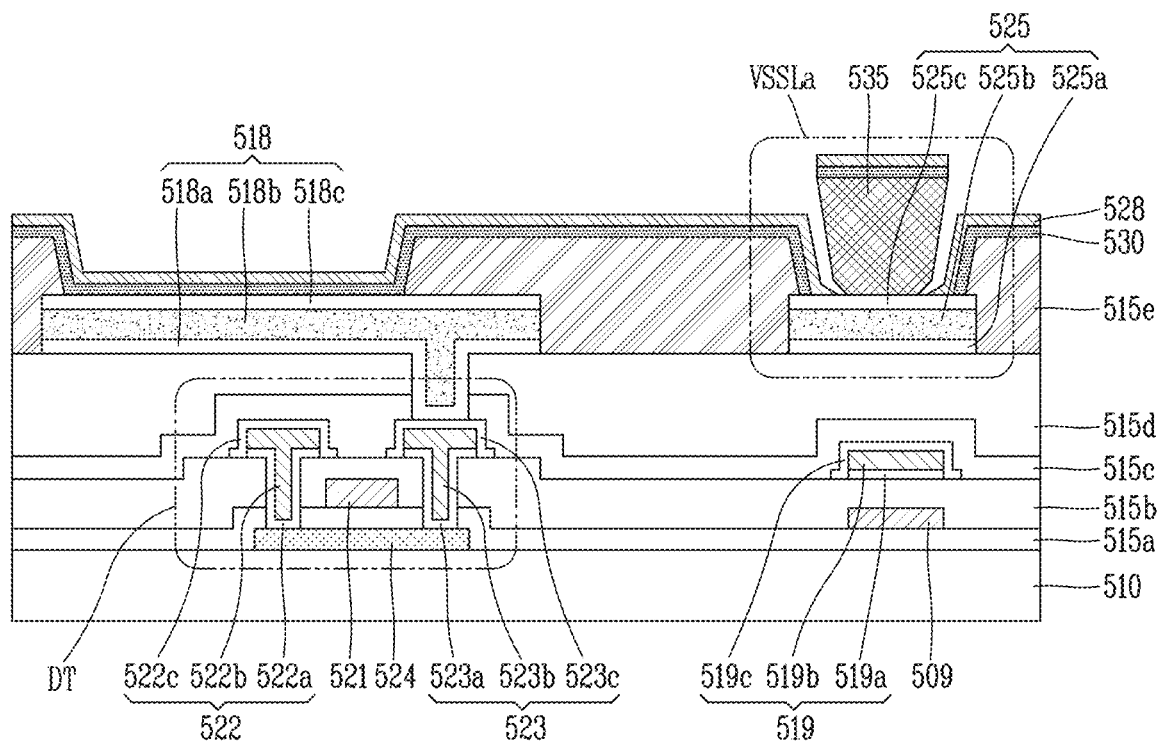
FIGS. 10A and 10B are sectional views schematically illustrating a partial structure of an OLED display device in accordance with a fifth embodiment of the present invention.
Figure 10B:
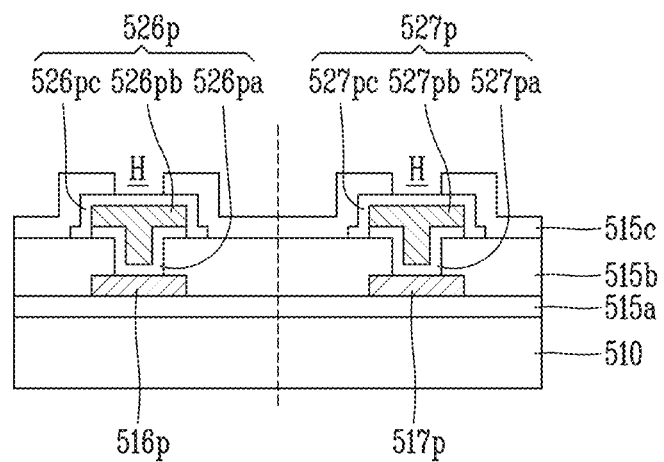

FIGS. 10A and 10B are sectional views schematically illustrating a partial structure of an OLED display device in accordance with a fifth embodiment of the present invention.

Here, FIG. 10A illustrates one exemplary sub pixel including a TFT part and a capacitor forming part of an OLED display device, and FIG. 10B sequentially illustrates parts of a gate pad area and a data pad area.

Specifically, FIG. 10A illustrates one exemplary sub pixel of a top emission type OLED display device using a coplanar TFT, but the present invention may not be limited to the coplanar TFT.

Referring to FIG. 10A, the top emission type OLED display device according to the second embodiment of the present invention includes a substrate 510, a driving TFT DT, an OLED and an auxiliary electrode line VSSLa. But it is not limited to this. The present invention may not include the auxiliary electrode line VSSLa.

First, as the same as the first to the fourth embodiments, the driving TFT DT includes a semiconductor layer 524, a gate electrode 521, a source electrode 522 and a drain electrode 523.

The semiconductor layer 524 is formed on a substrate 510 which is made of an insulating material, such as silicon Si, glass, transparent plastic or a polymer film. But it is not limited to this. In other words, the substrate 510 may be formed from any material capable of supporting pluralities of layers and elements.

The semiconductor layer 524 may be made of amorphous silicon or polycrystalline silicon with crystallized amorphous silicon.

Here, a buffer layer may further be located between the substrate 510 and the semiconductor layer 524. The buffer layer may be formed to protect the TFT from impurities such as alkaline ion discharged from the substrate 510 during crystallization of the semiconductor layer 524.

A gate insulating layer 515*a* which is made of silicon nitride ($SiN_x$) or silicon dioxide ($SiO_2$) is formed on the semiconductor layer 524, and a gate line including the gate electrode 521 and a lower sustaining electrode 509 are formed on the gate insulating layer 515*a*.

The gate insulating layer 515*a* may be formed in the display area and the pad area. In other words, the gate insulating layer 515*a* may be formed on the entire surface of the substrate 510 provided with the semiconductor layer 524. But it is not limited to this.

The gate electrode 521 may be formed in such a manner as to overlap with the semiconductor layer 524 within the display area.

The gate electrode 521 and the gate line may be formed in a single body united with each other.

The gate electrode 521, the gate line and the lower sustaining electrode 509 may be formed into a single layer or a multilayer made of a first metallic material having a low resistance characteristic, such as aluminum (Al), copper (Cu), molybdenum (Mo), chrome (Cr), gold (Au), titanium (Ti), nickel (Ni), neodymium (Nd), or alloy thereof.

Although the gate electrode 521, the gate line and the lower sustaining electrode 509 are formed in a single layer, they may be formed in a multi-layered structure including at least two layers.

An inter-layer insulating layer 515*b* which is made of silicon nitride or silicon dioxide is provided on the gate electrode 521, the gate line and the lower sustaining electrode 509. On the inter-layer insulating layer 515*b* are provided a data line, a driving voltage line, source and drain electrodes 522 and 523 and a upper sustaining electrode 519. Also, a plurality of contact holes may be formed in the inter-layer insulating layer 515*b*.

The source electrode 522 and the drain electrode 523 are spaced apart from each other by a predetermined interval, and electrically connected to the semiconductor layer 524. In more detail, a semiconductor layer contact hole through which the semiconductor layer 524 is exposed is formed through the gate insulating layer 515*a* and the inter-layer insulating layer 515*b*, such that the source and drain electrodes 522 and 523 are electrically connected to the semiconductor layer 524.

The source electrode 522 and the data line may be formed in a single body united with each other.

Here, the upper sustaining electrode 519 overlaps a part of the lower first sustaining electrode 509 with the inter-layer insulating layer 515*b* interposed therebetween, thereby forming a storage capacitor.

Here, the data line, the driving voltage line, the source and drain electrodes 522 and 523 and the upper sustaining electrode 519 according to the fifth embodiment of the present invention may have a multi-layered structure with three layers or more.

That is, the source electrode 522 may have a three-layered structure of a first source electrode layer 522*a*, a second source electrode layer 522*b* and a third source electrode layer 522*c*, and the drain electrode 523 may have a three-layered structure of a first drain electrode layer 523*a*, a second drain electrode layer 523*b* and a third drain electrode layer 523*c*.

The upper sustaining electrode 519 may also have a three-layered structure of a first upper sustaining electrode layer 519*a*, a second upper sustaining electrode layer 519*b* and a third upper sustaining electrode layer 519*c*.

The first source electrode layer 522*a*, the first drain electrode layer 523*a* and the first upper sustaining electrode layer 519*a* may be formed from the same material. Also, the first source electrode layer 522*a*, the first drain electrode layer 523*a* and the first upper sustaining electrode layer 519*a* may increase adhesive strengths of the second source electrode layer 522*b*, the second drain electrode layer 523*b* and the second upper sustaining electrode layer 519*b*.

For example, the first source electrode layer 522*a*, the first drain electrode layer 523*a* and the first upper sustaining electrode layer 519*a* may be formed from one of molybdenum titanium MoTi, titanium Ti or an alloy thereof.

The second source electrode layer 522*b*, the second drain electrode layer 523*b* and the second upper sustaining electrode layer 519*b* may be formed from the same material. Also, the second source electrode layer 522*b*, the second drain electrode layer 523*b* and the second upper sustaining electrode layer 519*b* may be formed from a low resistive material. For example, the second source electrode layer 522*b*, the second drain electrode layer 523*b* and the second upper sustaining electrode layer 519*b* may be formed from one selected from a material group which includes aluminum Al, tungsten W, copper Cu, silver Ag, molybdenum Mo, chromium Cr, tantalum Ta, titanium Ti, or alloys thereof. Preferably, the second source electrode layer 522*b*, the second drain electrode layer 523*b* and the second upper sustaining electrode layer 519*b* may be formed from copper Cu.

The third source electrode layer 522*c*, the third drain electrode layer 523*c* and the third upper sustaining electrode layer 519*c* may be formed from the same material. Also, the third source electrode layer 522*c*, the third drain electrode layer 523*c* and the third upper sustaining electrode layer 519*c* may be formed from a material which is not corroded by moisture and oxygen in spite of being exposed to the exterior. For example, the third source electrode layer 522*c*, the third drain electrode layer 523*c* and the third upper sustaining electrode layer 519*c* may be formed from one of molybdenum titanium MoTi, titanium Ti or an alloy thereof.

For example, the data wiring according to the fifth embodiment of the present invention may have a three-layered structure of MoTi/Cu/MoTi.

A passivation layer 515*c* and a planarization layer 515*d* are provided on the substrate 510 having data line, the driving voltage line, the source and drain electrodes 522 and 523 and the upper sustaining electrode 519.

Next, the OLED may include a first electrode 518, an organic compound layer 530 and a second electrode 528.

The OLED is electrically connected to the driving TFT DT. In more detail, a drain contact hole through which the drain electrode 523 of the driving TFT DT is exposed is formed through the passivation layer 515*c* and the planarization layer 515*d* which are located on the driving TFT DT.

That is, the first electrode 518 is provided on the planarization layer 515*d*, and electrically connected to the drain electrode 523 of the driving TFT DT through the drain contact hole.

The first electrode 518 is to supply a current (or a voltage) to the organic compound layer 530, and defines a light-emitting region with a predetermined area (or size).

The first electrode 518 serves as an anode. Accordingly, the first electrode 518 may include a transparent conductive material with a relatively great work function. Also, the first electrode 518 may be formed in a multi-layered structure including a plurality of electrode layers. For example, the first electrode 518 may be formed in a three-layered structure which is prepared by sequentially stacking a first electrode layer 518*a*, a second electrode layer 518*b* and third electrode layer 518*c*.

The first electrode layer 518*a* may increase the adhesive strength of the second electrode layer 518*b*. The first electrode layer 518*a* may be formed of Indium Tin Oxide (ITO) or Indium Zinc Oxide (IZO). To improve reflectivity, the second electrode layer 518*b* may be a reflection layer made of a metal with high reflectivity. Examples of the metal having the high reflectivity may include aluminum (Al), silver (Ag), gold (Au), platinum (Pt), chrome (Cr) or alloy thereof.

The third electrode layer 518*c* may have a high work function. As such, the first electrode 518 may be used as the anode electrode. Such a third electrode layer 518*c* may be a transparent conductive layer. For example, the third electrode layer 518*c* may be formed from ITO or IZO. However, the present invention may not be limited to this.

A bank 515*e* is formed on the substrate 510 having the first electrode 518. Here, the bank 515*e* defines a first opening by surrounding an edge of the first electrode 518 like a bank. The bank 515*e* may be made of an organic or inorganic insulating material. The bank 515*e* may also be made of a photosensitive material containing black pigments. In this instance, the bank 515*e* serves as a shielding member.

The bank 515*e* may be formed to surround edges of the first electrode 518. As such, any corrosion of the edges of the first electrode 518 may be prevented.

Here, in the fifth embodiment of the present invention, the bank 515*e* further include a second opening through which an auxiliary electrode 525 to be explained later is partially exposed.

The organic compound layer 530 is provided between the first electrode 518 and the second electrode 528. The organic compound layer 530 emits light as holes supplied from the first electrode 518 and electrons supplied from the second electrode 528 are coupled to each other.

Here, FIG. 10A illustrates an example that the organic compound layer 230 is formed on an entire surface of the substrate 210. However, the present invention may not be limited to this. The organic compound layer 230 may also be formed on the first electrode 218.

Although it is shown in FIG. 10A that the organic compound layer 530 is formed in a single layer, the organic compound layer 530 is not limited to this. The organic compound layer 530 may have a multi-layered structure including a light-emitting layer to emit light and an auxiliary layer for improving light-emission efficiency of the light-emitting layer.

The second electrode 528 is formed on the organic compound layer 530 to supply electrons to the organic compound layer 530.

The second electrode 528 serves as a cathode. Accordingly, the second electrode 528 may be made of a transparent conductive material. An example of the transparent conductive material may include ITO or IZO. The second electrode 528 may further include a metal layer which is provided at a side contactable with the organic compound layer 530 and is formed of a metal with a low work function. Examples of the metal with the low work function may include magnesium (Mg), silver (Ag) and a compound thereof.

As the same as the first to the fourth embodiments of the present invention, an auxiliary electrode line VSSLa and the first electrode 518 are provided on the same layer to reduce resistance of the second electrode 528. Here, the auxiliary electrode line VSSLa includes the auxiliary electrode 525 and the barrier wall 535.

The auxiliary electrode 525 and the first electrode 518 are formed on the same layer, The auxiliary electrode 525 is spaced apart from the first electrode 518. For example, the auxiliary electrode 525 may extend long in one direction to be connected to an external VSS pad.

The auxiliary electrode 525 may be implemented into a three-layered structure of a first auxiliary electrode layer 525a, a second auxiliary electrode layer 525b and a third auxiliary electrode layer 525c, as substantially the same as the structure of the first electrode 518. In this instance, upon depositing the second electrode 528, the second electrode 528 may come in contact directly with the third auxiliary electrode layer 525c of the auxiliary electrode 525. That is, the second electrode 528 is deposited even to a lower portion of the barrier wall 535 so as to come in contact with the auxiliary electrode 525. However, the present invention may not be limited to this.

The barrier wall 535 is located on the auxiliary electrode 525.

Here, the barrier wall 535 may have a tapering shape that its cross-section is reduced from top to bottom thereof. For example, an angle formed by a side surface of the barrier wall 535 and the auxiliary electrode 525 may be in the range of 20 to 80°. This reverse tapering shape having the angle at the side surface may derive a shading effect to be explained later.

The barrier wall 535 forms an electrode contact hole through the organic compound layer 530 so as to expose the auxiliary electrode 525 therethrough. The organic compound layer 530 is formed on a top of the barrier wall 535, but not formed below the barrier wall 535 by the shading effect. Accordingly, the electrode contact hole is formed through the organic compound layer 530.

The organic compound layer 530 and the second electrode 528 are sequentially stacked (laminated) on the barrier wall 535.

The pad area is an edge area of the TFT substrate 510 having the display area. The pad area includes a gate pad area and a data pad area.

Referring to FIG. 10B, a gate pad electrode 526p and a data pad electrode 527p which are electrically connected to a gate line and a data line, respectively, are located on the gate pad area and the data pad area. The gate pad electrode 526p and the data pad electrode 527p transfer a scan signal and a data signal applied from an external driving circuit to the gate line and the data line, respectively.

That is, the gate line and the data line extend toward the driving circuit to be connected to corresponding gate pad line 516p and data pad line 517p, respectively. The gate pad line 516p and the data pad line 517p are electrically connected to the gate pad electrode 526p and the data pad electrode 527p, respectively. Therefore, the gate line and the data line receive the scan signal and the data signal, respectively, from the driving circuit through the gate pad electrode 526p and the data pad electrode 527p.

The gate pad line 516p and the gate line may be formed in a single body united with each other.

Moreover, the gate pad line 516p and the data pad line 517p may be formed through the same process as the gate line and the gate electrode 521.

The data pad electrode 527p and the data line may be formed in a single body united with each other.

Also, the gate pad electrode 526p and the data pad electrode 527p may be formed through the same process as the data line and the source and drain electrodes 522 and 523.

Although the gate pad line 516p and the data pad line 517p are formed in a single layer, they may be formed in a multi-layered structure including at least two layers.

A plurality of contact holes exposing the gate pad line 516p and the data pad line 517p may be formed in the inter-layer insulating layer 515b of the pad area. Also, an open hole H exposing the gate pad electrode 526p and the data pad electrode 527p may be formed in the passivation layer 515c of the pad area.

The gate pad electrode 526p and the data pad electrode 527p according to the fifth embodiment of the present invention are formed on the same layer as the data wiring of the display area, here have substantially the same three-layered structure as the data wiring, for example, the three-layered structure of MoTi/Cu/MoTi.

That is, in the fifth embodiment of the present invention, the three-layered structure of MoTi/Cu/MoTi having etch selectivity with respect to an etchant for etching Ag or Ag alloy is applied to the gate pad electrode 526p and the data pad electrode 527p of the pad area, and also parts of the gate pad electrode 526p and the data pad electrode 527p are externally exposed by forming an open hole H during patterning of the passivation layer 515c.

In this instance, the upper MoTi may serve as an etch stopper of the etchant etching Ag or Ag alloy.

As described above, in order to pattern the first electrode 518, a phosphoric acid-based etchant, a nitric acid-based etchant, a phosphoric acid+nitric acid-based etchant, a phosphoric acid+acetic acid-based etchant, a nitric acid+acetic acid-based etchant, or a phosphoric acid+nitric acid+acetic acid-based etchant may be used. Also, in order to pattern the first electrode 518, an etchant that does not contain hydrofluoric acid potassium and hydrogen peroxide may be used.

The gate pad electrode 526p according to the fifth embodiment of the present invention may have the three-layered structure of a first gate pad electrode layer 526pa, a second gate pad electrode layer 526pb and a third gate pad electrode layer 526pc, and the data pad electrode 527p may have the three-layered structure of a first data pad electrode layer 527pa, a second data pad electrode layer 527pb and a third data pad electrode layer 527pc.

The lowermost layers, i.e. the first gate pad electrode layer 526pa and the first data pad electrode layer 527pa may be an adhesion promoting layer increasing the adhesive strength of the second gate pad electrode layer 526pb and the second data pad electrode layer 527pb. That is, the first gate pad electrode layer 526pa may be made of a material configured so as to increase the adhesion between the second gate pad electrode layer 526pb and a fourth pad electrode layer, i.e. the gate pad line 516p. Also, the first data pad electrode layer 527pa may be made of a material configured so as to increase the adhesion between the second data pad electrode layer 527pb and the data pad line 517p.

The second gate pad electrode layer 526pb and the second data pad electrode layer 527pb may be formed from a low resistive material compared with the first gate pad electrode layer 526pa, the first data pad electrode layer 527pc and the third gate pad electrode layer 526pc, the third data pad electrode layer 527pc.

The pad electrodes 526p and 527p must be externally exposed for the connection with an external driver later. The pad electrodes 526p and 527p formed from copper Cu or others can be easy to transfer signals because of their low resistance. Meanwhile, the exposed pad electrodes 526p and 527p may be corroded by external moisture and oxygen. Moreover, the pad electrodes 526p and 527p formed from copper Cu or others can be etched at the formation of the first electrode 518 which is performed for the formation of the OLED later.

To address this matter, the uppermost third pad electrode layers 526pc and 527pc may be formed from a material which is not corroded by oxygen and moisture, even though they are externally exposed. In other words, the third pad electrode layers 526pc and 527pc may be formed from a material being not etched by an etchant which may be used to form the first electrode 518. For example, the third pad electrode layers 526pc and 527pc may be formed from one of molybdenum titanium MoTi, titanium Ti or an alloy thereof.

Also, the passivation layer 515c may be formed in such a manner as to expose upper surfaces of the third pad electrode layers 526pc and 527pc of the pad electrodes 526p and 527p. In other words, the passivation layer 515c may be formed in such a manner as to surround edges of the upper surfaces of the pad electrodes 526p and 527p. As such, any corrosion of the sides of the third pad electrode layers 526pc and 527pc may be prevented. For example, the passivation layer 515c may be formed in such a manner as to cover sides of the third pad electrode layers 526pc and 527pc, and at least some portions of the upper surfaces of the third pad electrode layers 526pc and 527pc.

Here, when the etchant for etching Ag or Ag alloy permeates into a crack generated due to impurity or a crack which is generated during patterning of the passivation layer 515c, it may damage Cu of the gate pad electrode 526p and the data pad electrode 527p. To prevent the damage, the fifth embodiment of the present invention employs a clad structure in which the third gate pad electrode layer 526pc and the third data pad electrode layer 527pc cover the first and second gate pad electrode layers 526pb and 526pa and the first and second data pad electrode layers 527pb and 527pa.

Such structure provides several effects of improvement of reliability, reduction of defects and improvement of productivity.

To form the clad structure, for example, after patterning the first and second gate pad electrode layers 526pb and 526pa and the first and second data pad electrode layers 527pb and 527pa, followed by patterning the third gate pad electrode layer 526pc and the third data pad electrode layer 527pc thereon. In this instance, the third gate pad electrode layer 526pc and the third data pad electrode layer 527pc may have more increased widths than the first and second gate pad electrode layers 526pb and 526pa and the first and second data pad electrode layers 527pb and 527pa.

That is, the third gate pad electrode layer 526pc and the third data pad electrode layer 527pc may be configured so as to be in contact with both sides of the first gate pad electrode layer 526pa and the first data pad electrode layer 527pa, respectively, then so as to seal the second gate pad electrode layer 526pb and the second data pad electrode layer 527pb.

For reference, when the gate pad electrode 526p and the data pad electrode 527c according to the fifth embodiment of the present invention may be patterned to the three-layered structure of MoTi/Cu/MoTi as the aforementioned second embodiment, Cu may be etched faster than MoTi according to the different etching speed between the Cu and MoTi for the patterning of MoTi/Cu/MoTi through a photolithography process.

Thus, an overhang structure having extruded MoTi layer as eaves may be formed. Because of the overhang structure, the crack may be formed during the forming of the gate pad electrode 226p and the data pad electrode 227p. Therefore, when the etchant for etching Ag or Ag alloy permeates in the crack, the gate pad electrode 226p and the data pad electrode 227p may be damaged.

Therefore, in the fifth embodiment of the present invention, the formation of the overhang structure can be prevented by using the clad structure of covering the upper MoTi after first patterning Cu/MoTi.

Hereinafter, a method of fabricating an OLED display device according to the fifth embodiment of the present invention having the configuration will be described in detail with reference to the accompanying drawings.

FIGS. 11A to 11J are sectional views sequentially illustrating a method of fabricating the OLED display device according to the fifth embodiment illustrated in FIG. 10A, which sequentially illustrates a method of fabricating a TFT substrate of a display area.

And, FIGS. 12A to 12F are sectional views sequentially illustrating a method of fabricating the OLED display device according to the fifth embodiment illustrated in FIG. 10B, which sequentially illustrates a method of fabricating a TFT substrate of a pad area.

Figure 11A:
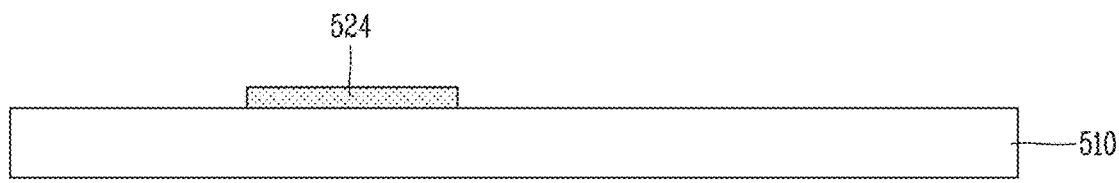
FIGS. 11A to 11J are sectional views sequentially illustrating a method of fabricating the OLED display device according to the fifth embodiment illustrated in FIG. 10A, and FIGS. 12A to 12F are sectional views sequentially illustrating a method of fabricating the OLED display device according to the fifth embodiment illustrated in FIG. 10B.
Figure 12A:
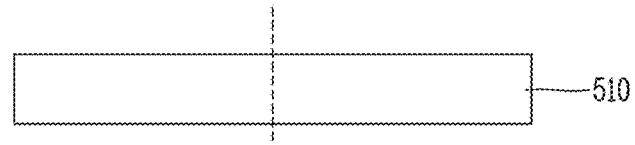

As illustrated in FIGS. 11A and 12A, a substrate 510 which is made of an insulating material, such as a transparent glass material, transparent plastic with high flexibility, a polymer film or the like is provided.

Although not illustrated, a TFT and a storage capacitor are formed on each of red, green and blue sub pixels of the substrate 510.

First, a buffer layer is formed on the substrate 510.

Here, the buffer layer may be formed to protect the TFT from impurities such as alkaline ion discharged from the substrate 510 during crystallization of a semiconductor layer. The buffer layer may be made of silicon dioxide.

Next, a semiconductor thin film is formed on the substrate 510 having the buffer layer.

The semiconductor thin film may be made of amorphous silicon, polycrystalline silicon, or oxide semiconductor.

Here, the polycrystalline silicon may be generated by employing various crystallization methods after depositing amorphous silicon on the substrate 210. When the oxide semiconductor is used as the semiconductor thin film, the oxide semiconductor may be deposited, followed by a predetermined thermal treatment therefor.

Afterwards, the semiconductor thin film is selectively removed through a photolithography process to form a semiconductor layer 524, which is formed of the semiconductor thin film, on the substrate 510 of the display area.

Figure 11B:
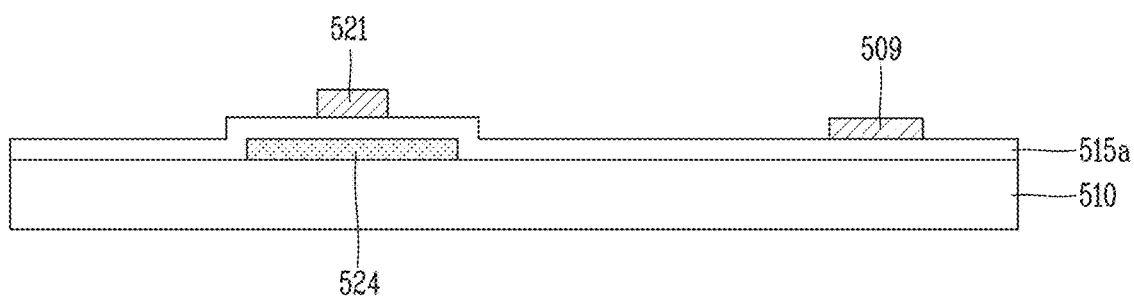
Figure 12B:
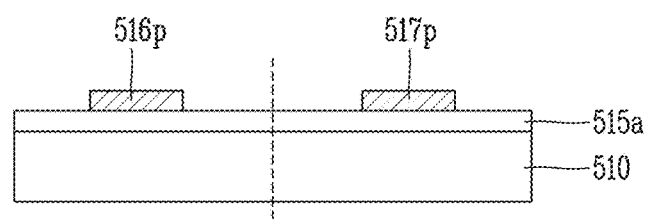

As illustrated in FIGS. 11B and 12B, a gate insulating layer 515a and a first conductive layer are formed on the substrate 510 having the semiconductor layer 524.

The gate insulating layer 515a may be formed on the entire surface of the substrate 510 provided with the semiconductor layer 524.

The first conductive layer may be provided to form a gate line, and made of a low-resistant opaque conductive material, such as aluminum (Al), copper (Cu), molybdenum (Mo), chrome (Cr), gold (Au), titanium (Ti), nickel (Ni), neodymium (Nd) or alloy thereof. However, these materials may have a multi-layered structure including two conductive layers which exhibit different physical properties. One of the conductive layers may be made of a metal with low resistivity, for example, aluminum-based metal, silver-based metal, copper-based metal or the like, so as to reduce a signal delay or a voltage drop.

Afterwards, the first conductive layer is selectively removed through the photolithography process. Accordingly, a gate line including a gate electrode 521, which is made of the first conductive layer, and a lower sustaining electrode 509 are formed on the substrate 510 of the display area, and also a gate pad line 516p and a data pad line 517p, which are formed of the first conductive layer, are formed on the substrate 510 on a pad area.

The gate electrode 521 may be formed in such a manner as to overlap with the semiconductor layer 524 within the display area.

The gate pad line 516p and the gate line may be formed in a single body united with each other.

Although the gate electrode 521, the gate line, the lower sustaining electrode 509 and the gate pad line 516p are formed in a single layer, they may be formed in a multi-layered structure including at least two layers.

However, the present invention may not be limited to this. The gate line including the semiconductor layer 524 and the gate electrode 521, the lower sustaining electrode 509, the gate pad line 516p and the data pad line 517p may be simultaneously formed through one photolithography process.

Also, the lower gate insulating layer 515a may also be patterned together during patterning of the gate line having the gate electrode 521, the lower sustaining electrode 509, the gate pad line 516p and the data pad line 517p.

Figure 11C:
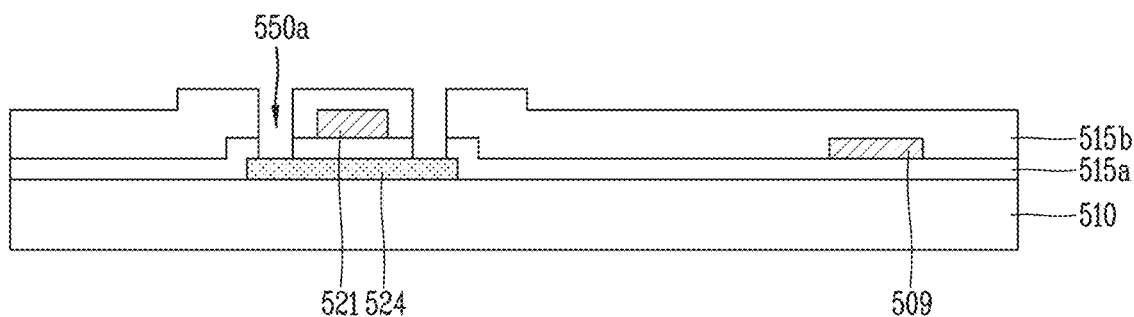
Figure 12C:
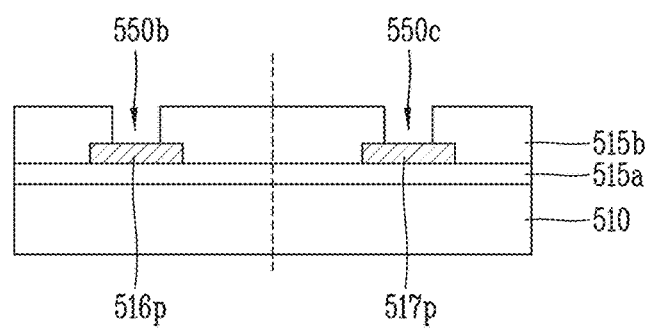

Next, as illustrated in FIGS. 11C and 12C, an inter-layer insulating layer 515b, which is made of silicon nitride or silicon dioxide is formed on the entire surface of the substrate 510 having the gate line having the gate electrode 521, the lower sustaining electrode 509, the gate pad line 516p and the data pad line 517p.

The inter-layer insulating layer 515b may be formed on entire surface of the substrate 510.

The inter-layer insulating layer 515b and the gate insulating layer 515a are selectively patterned through the photolithography. Accordingly, a first contact hole 550a is formed such that a source/drain area of the semiconductor layer 524 is exposed therethrough, and also a second contact hole 550b and a third contact hole 550c are formed, respectively, such that parts of the gate pad line 516p and the data pad line 517p are exposed therethrough.

Figure 11D:
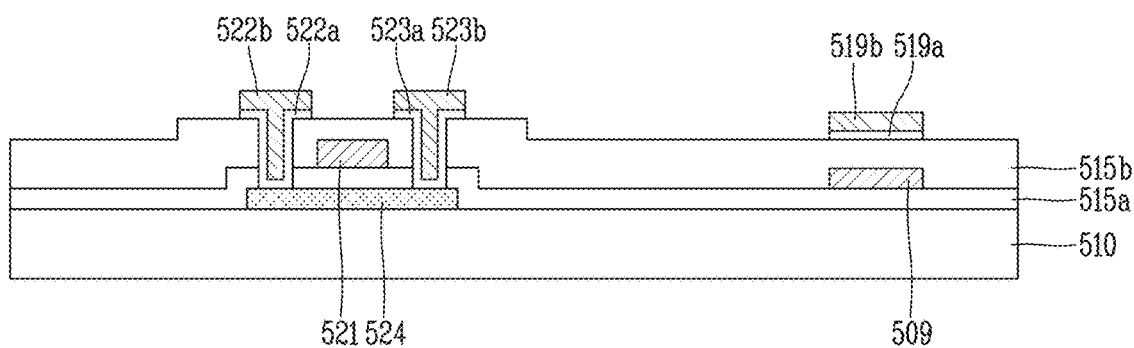
Figure 12D:
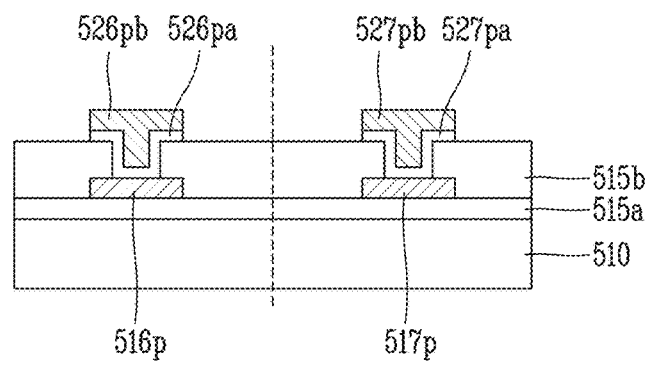

As illustrated in FIGS. 11D and 12D, after forming a second conductive layer and a third conductive layer on the entire surface of the substrate 510 having the inter-layer insulating layer 515b, the second and third conductive layers are selectively removed through the photolithography process, thereby forming on the substrate 510 of the display area a primary data wiring (namely, first and second source and drain electrode layers 522b, 522a, 523b and 523a, first and second driving voltage line layers, first and second data line layers and first and second upper sustaining electrode layers 519b and 519a), which is made of the second and third conductive layers.

Simultaneously, on the substrate 510 of the pad area is formed a primary pad electrode (namely, first and second gate pad electrode layers 526pb and 526pa and first and second data pad electrode layers 527pb and 527pa), which is made of the second and third conductive layers.

Here, the third conductive layer is made of a low-resistant opaque conductive material, such as aluminum (Al), copper (Cu), molybdenum (Mo), chrome (Cr), gold (Au), titanium (Ti), nickel (Ni), neodymium (Nd), or alloy thereof, in order to form the middle data line and pad electrode. However, these may have a multi-layered structure including two conductive layers which exhibit different physical properties. Specifically, in the third embodiment of the present invention, the third conductive layer is made of Cu which may be etched with respect to an etchant for etching Ag or Ag alloy.

Also, the second conductive layer may be made of MoTi in order to form the lower data line and the lower pad electrode. However, the present invention may not be limited to this. The second conductive layer may also be made of any other material if it can increase a contact characteristic with a lower layer. For example, the second conductive layer may be formed from one of molybdenum titanium MoTi, titanium Ti or an alloy thereof.

Figure 11E:
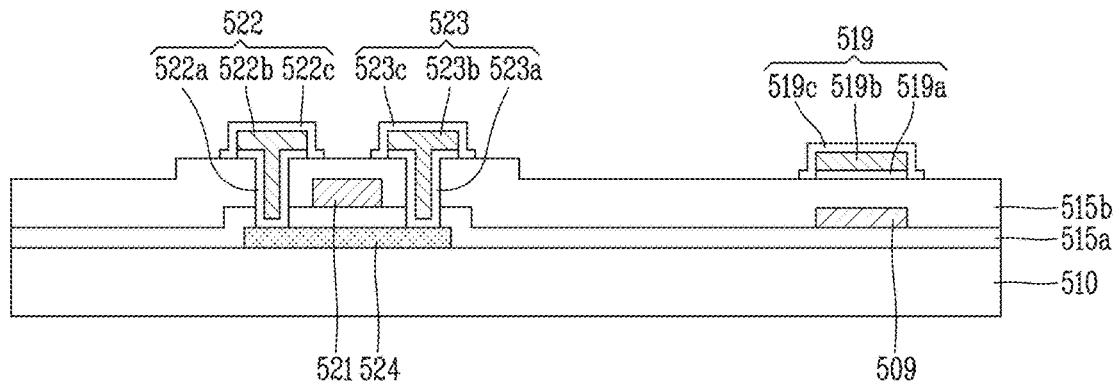
Figure 12E:
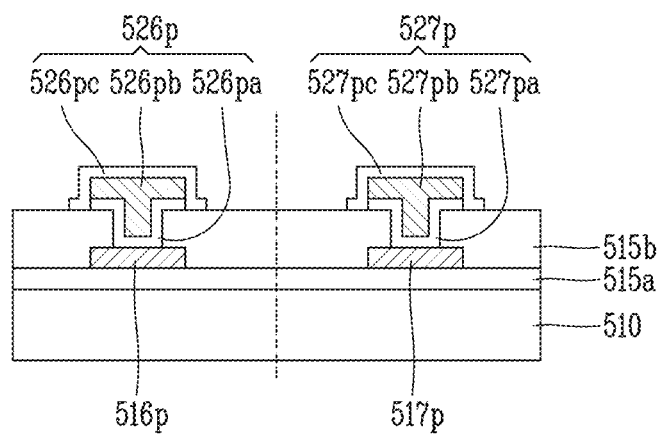

As illustrated in FIGS. 11E and 12E, after forming a fourth conductive layer on the entire surface of the substrate 510 having the primary data wiring, the fourth conductive layer is selectively removed through the photolithography, thereby forming on the substrate 510 of the display area a secondary data wiring (namely, third source and drain electrode layers 522c and 523c, a third driving voltage line layer, a third data line layer and a third upper sustaining electrode layer 519c), which is made of the fourth conductive layer.

Simultaneously, on the substrate 510 of the pad area is formed a secondary pad electrode (namely, a third gate pad electrode layer 526pc and a third data pad electrode layer 527pc), which is made of the fourth conductive layer.

Here, the fourth conductive layer may be made of MoTi in order to form the third data wiring and pad electrode. However, the present invention may not be limited to this. The fourth conductive layer may also be made of any other material if it can be used as an etch stopper of an etchant for etching Ag or Ag alloy.

In this manner, through the twice patterning, a source electrode 522 which has a three-layered structure of the first source electrode layer 522a, the second source electrode layer 522b and the third source electrode layer 522c, and a drain electrode 523 which has a three-layered structure of the first drain electrode layer 523a, the second drain electrode layer 523b and the third drain electrode layer 523c may be formed on the substrate 510 of the display area.

Also, an upper sustaining electrode 519, which has a three-layered structure of the first upper sustaining electrode layer 519a, the second upper sustaining electrode layer 519b and the third upper sustaining electrode layer 519c may be formed on the lower sustaining electrode 509.

Simultaneously, a gate pad electrode 526p which has a three-layered structure of the first gate pad electrode layer 526pa, the second gate pad electrode layer 526pb and the third gate pad electrode layer 526pc, and a data pad electrode 527p which has a three-layered structure of the first data pad electrode layer 527pa, the second data pad electrode layer 527pb and the third data pad electrode layer 527pc may be formed on the substrate 510 of the pad area.

Here, as aforementioned, the data wiring and the pad electrode according to the fifth embodiment of the present invention may have the three-layered structure of MoTi/Cu/MoTi.

Meanwhile, the fifth embodiment of the present invention may employ a clad structure that the secondary pad electrode, namely, the third gate pad electrode layer 526pc and the third data pad electrode layer 527pc, covers the primary pad electrode, namely, the first and second gate pad electrode layers 526pb and 526pa and the first and second data pad electrode layers 527pb and 527pa. This structure can prevent in advance the etchant for etching Ag or Ag alloy from damaging the Cu of the gate pad electrode 526p and the data pad electrode 527p due to permeating into a crack generated by impurities or a crack generated during patterning of a passivation layer.

The third gate pad electrode layer 526pc and the third data pad electrode layer 527pc may be configured so as to be in contact with both sides of the first gate pad electrode layer 526pa and the first data pad electrode layer 527pa, respectively, then so as to seal the second gate pad electrode layer 526pb and the second data pad electrode layer 527pb.

Here, the source and drain electrodes 522 and 523 are electrically connected to the source/drain area of the semiconductor layer 524 through the first contact hole. The upper sustaining electrode 519 overlaps a part of the lower sustaining electrode 509 with interposing the inter-layer insulating layer 515b therebetween, thereby forming a storage capacitor.

The gate pad electrode 526p and the data pad electrode 527p are electrically connected to the gate pad line 516p and data pad line 517p through the second and third contact holes, respectively.

Figure 11F:
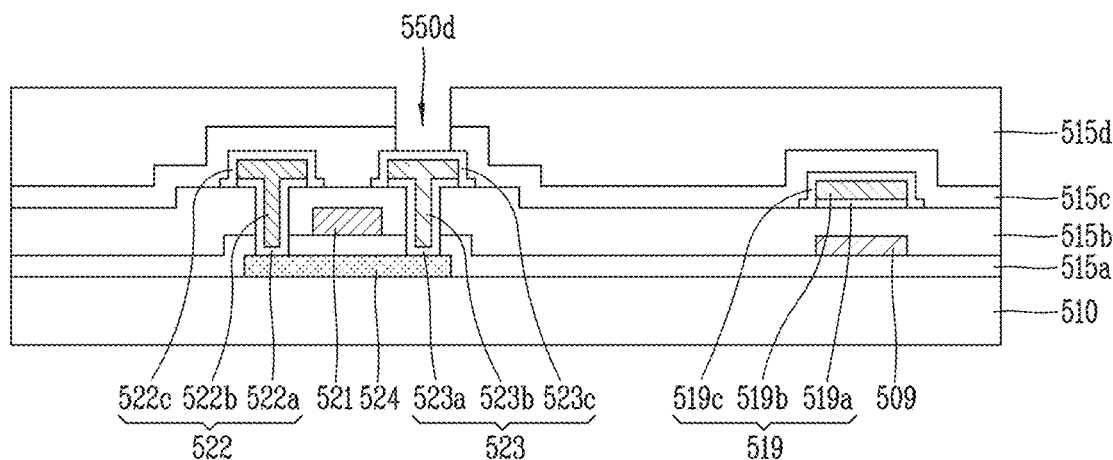
Figure 12F:
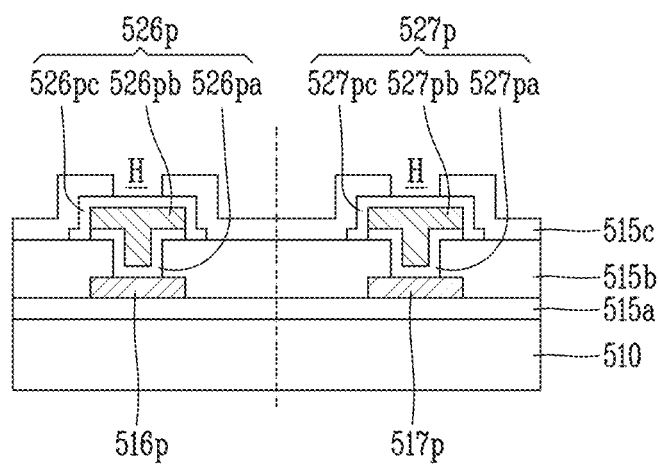

Afterwards, as illustrated in FIGS. 11F and 12F, a passivation layer 515c which is made of silicon nitride or silicon dioxide is formed on the substrate 510 of the display area on which the source and drain electrodes 522 and 523, the driving voltage line, the data line, the upper sustaining electrode 519, the gate pad electrode 526p and the data pad electrode 527p are formed.

Here, a planarization layer 515d made of an organic insulating material may be formed on the passivation layer 515c, but the present invention may not be limited to this. The passivation layer may also function as the planarization layer.

The passivation layer 515c and the planarization layer 515d are selectively patterned through the photolithography process, thereby forming a fourth contact hole 550d through which the drain electrode 523 is exposed, and an open hole H through which parts of the gate pad electrode 526p and the data pad electrode 527p are externally exposed.

Figure 11G:
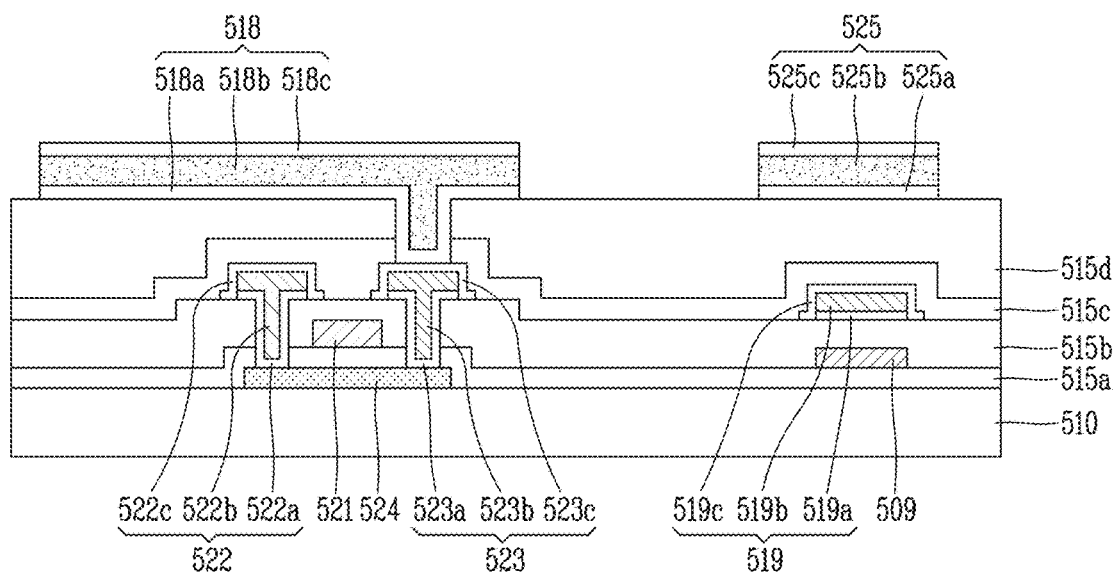

Next, as illustrated in FIG. 11G, fifth to seventh conductive layers are formed on the entire surface of the substrate 510 having the planarization layer 515d.

However, the present invention may not be limited to this. For example, only the fifth conductive layer may also be formed as a single layer on the entire surface of the substrate 510 having the planarization layer 515d.

The fifth conductive layer and the seventh conductive layer may be made of a transparent conductive material, such as ITO or IZO.

The sixth conductive layer may be made of aluminum (Al), silver (Ag), gold (Au), platinum (Pt), chrome (Cr) or alloy thereof.

Afterwards, by selectively patterning the fifth to seventh conductive layers through the photolithography process, a first electrode 518 and an auxiliary electrode 525 made of the fifth to seventh conductive layers are formed.

Here, the first electrode 518 may include a first electrode layer 518a, a second electrode layer 518b and a third electrode layer 518c which are made of the fifth to seventh conductive layers, respectively.

The auxiliary electrode 525 may include a first auxiliary electrode layer 525a, a second auxiliary electrode layer 525b and a third auxiliary electrode layer 525c which are made of the fifth to seventh conductive layers, respectively.

The first electrode 518 as an anode may be electrically connected to the drain electrode 523 of the driving TFT through the fourth contact hole.

Also, the first electrode 518 is formed on the substrate 510 to correspond to each of red, green and blue sub pixels.

Figure 11H:
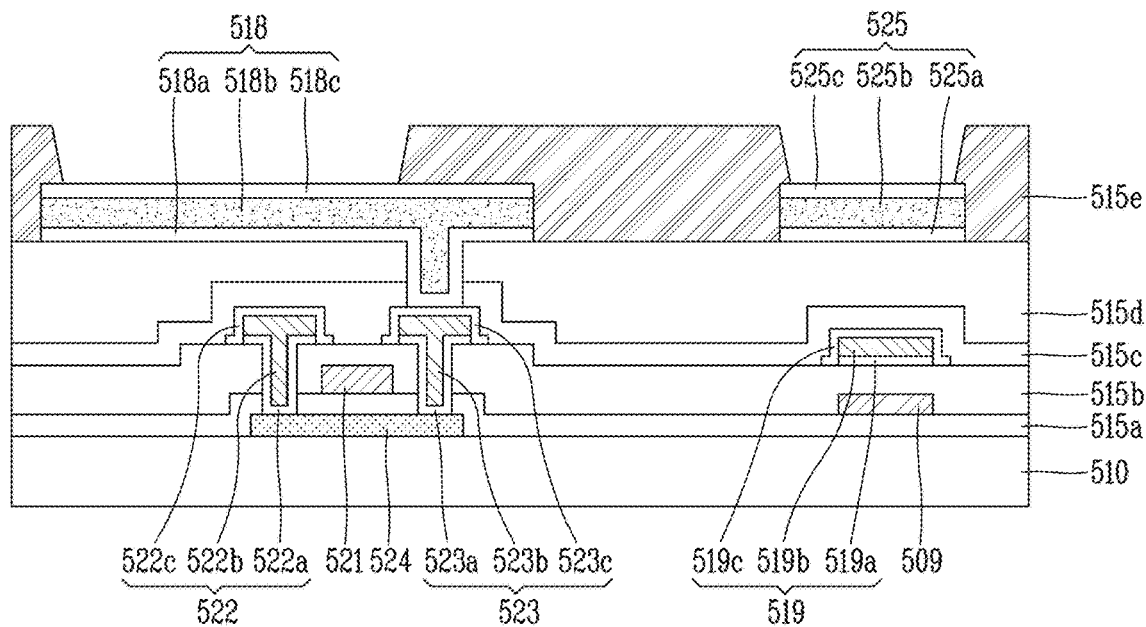

Next, as illustrated in FIG. 11H, a predetermined bank 515e is formed on the substrate 510 of the display area having the first electrode 518 and the auxiliary electrode 525.

Here, the bank 515e defines an opening by surrounding an edge region of the first electrode 518 like a bank and is made of an organic or inorganic insulating material. The bank 515e may also be made of a photosensitive material containing black pigments, and in this instance, the bank 515e may serve as a shielding member.

Also, the bank 515e further includes a second opening through which the auxiliary electrode 525 is partially exposed.

Figure 11I:
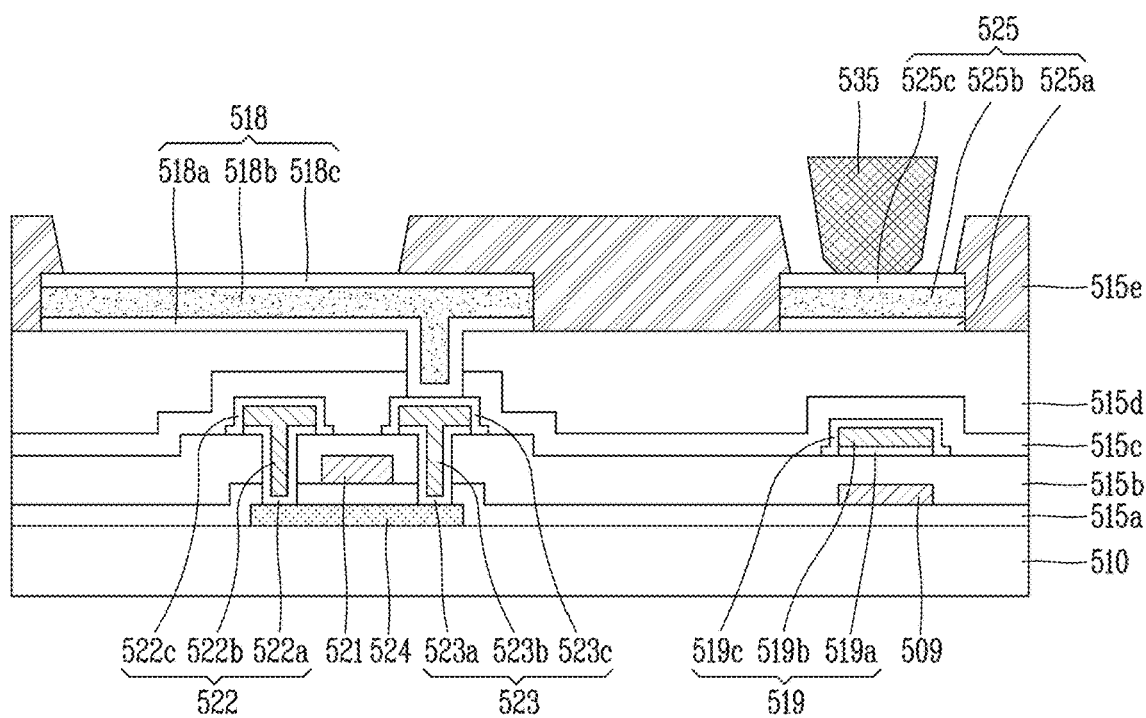

As illustrated in FIG. 11I, a barrier wall 535 is formed on the substrate 510 having the bank 515e.

The barrier wall 535 is located on the auxiliary electrode 525.

Here, the barrier wall 535 may have a reverse tapering shape that its section is reduced from top to bottom thereof. For example, an angle formed by a side surface of the barrier wall 535 and the auxiliary electrode 525 may be in the range of 20 to 80°. This reverse tapering shape having the angle at the side surface may derive a shading effect to be explained later.

Figure 11J:
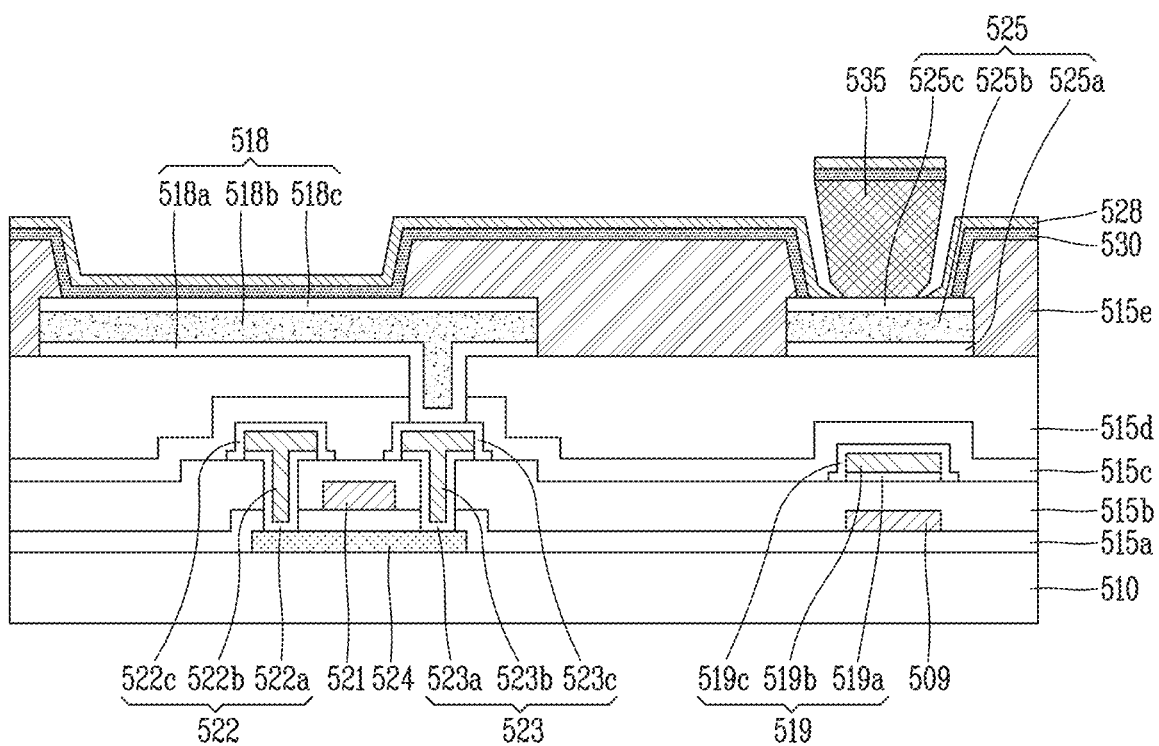

Next, as illustrated in FIG. 11J, an organic compound layer 530 is formed on the substrate 510 having the barrier wall 535 by way of evaporation.

In this instance, the barrier wall 535 forms an electrode contact hole, through which the auxiliary electrode 525 is exposed, on the organic compound layer 530. The organic compound layer 530 is formed on the top the barrier wall 535, and not formed below the top of the barrier wall 535 by the shading effect. Accordingly, the electrode contact hole is formed through the organic contact hole 530.

To this end, although not illustrated, a hole injection layer and a hole transport layer are sequentially formed on the substrate 510.

Here, the hole injection layer and the hole transport layer are commonly formed on each of the red, green and blue sub pixels, so as to allow for smooth injection and transport of the holes. Here, one of the hole injection layer and the hole transport layer may be omitted.

Next, a light-emitting layer is formed on the substrate 510 having the hole transport layer.

The light-emitting layer may include a red light-emitting layer, a green light-emitting layer and a blue-light emitting layer to correspond to the red, green and blue sub pixels.

An electron transport layer is then formed on the substrate 510 having the light-emitting layer.

The electron transport layer is commonly formed on each of the red, green and blue sub pixels on the light-emitting layer, so as to allow for smooth transport of the electrons.

An electron injection layer for smooth injection of the electrons may further be formed on the electron transport layer.

A second electrode 528 made of an eighth conductive layer is formed on the substrate 510 having the electron transport layer in a sputtering manner.

Here, the eighth conductive layer is deposited even to a lower portion of the barrier wall 535 such that the second electrode 528 can come in contact with the auxiliary electrode 525.

The thusly-fabricated OLED is encapsulated by a predetermined thin film encapsulation layer.

A polarization film for reducing reflection of external light of the OLED display device so as to improve a contrast ratio may be provided on the thin film encapsulation layer.

As aforementioned, an OLED display device and a method of fabricating the same according to one embodiment of the present invention can improve luminance uniformity of a panel by reducing resistance of a cathode in a manner of forming an auxiliary electrode.

Also, a pad electrode may be formed of a plurality of pad electrode layers and an uppermost layer of the pad electrode layers may be formed a material capable of preventing (or minimizing) a corrosion from moisture and oxygen, to prevent (or minimize) the corrosion of the pad electrode and an occurrence of migration. This may result in preventing (or minimizing) a defect of the transmission of signals.

Moreover, a clad structure (or other protective configuration) may be applied to a pad electrode of a pad area and a low-resistance pad electrode layer may be sealed by the clad structure, to prevent (or minimize) corrosion due to moisture and oxygen and prevent (or minimize) damage on the pad electrode due to an etchant during patterning of an anode. This may result in improvement in device reliability, reduction of defectives in the OLED display device, and improvement in manufacturing productivity.

Moreover, an OLED display device and a method of fabricating the same according to one embodiment of the present invention can reduce production costs by simplifying the process required to form a plurality of the pad electrode layers.

It will be apparent to those skilled in the art that various modifications and variations can be made in the organic light-emitting diode display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. An organic light-emitting diode (OLED) display device, comprising:
   a substrate including a display area and a pad area;
   a gate line and a data line in the display area;
   a pad line and a pad electrode in the pad area;
   an inter-layer insulating layer interposed between the pad line and the pad electrode, and between the gate line and the data line;
   a patterned anode in the display area; and
   an encapsulation layer on the substrate for covering the display area,
   wherein the pad area is exposed without being covered by the encapsulation layer to couple a flexible printed circuit board,
   wherein the pad electrode is a three-layered structure,
   wherein an uppermost layer and a lowermost layer of the three-layered structure are of the same material,
   wherein an intermediate layer of the three-layered structure is comprised of a low resistive material compared with materials of the uppermost and lowermost layers,
   wherein the uppermost layer is in contact with both sides of the lowermost layer to seal the intermediate layer, and
   wherein the pad line is comprised of a conductive material to transfer a scan signal and a data signal to the gate line and the data line, respectively, and is disposed below the lowermost layer and contacted with the lowermost layer.

2. The display device of claim 1, wherein the intermediate layer includes Cu, and the uppermost layer includes MoTi, Ti, or its alloy.

3. The display device of claim 2, wherein a material of the uppermost layer is the same as that of the lowermost layer.

4. The display device of claim 2, further comprising a passivation layer covering sides of the uppermost, intermediate and lowermost layers, and at least some portions of an upper surface of the uppermost layer.

5. The display device of claim 1, wherein the pad electrode and the data line are on the same layer.

6. The display device of claim 1, wherein the anode includes at least one among Ag, Al, Ag alloy, and Al alloy.

7. The display device of claim 6, wherein a material of the pad electrode is not the same as that of the anode.

8. The display device of claim 1, wherein the inter-layer insulating layer covers an edge of the pad line.

9. The display device of claim 1, wherein the inter-layer insulating layer covers some portion of an upper surface of the pad line.

* * * * *